(12) United States Patent
Dyer et al.

(10) Patent No.: US 9,157,980 B2
(45) Date of Patent: Oct. 13, 2015

(54) MEASURING METAL LINE SPACING IN SEMICONDUCTOR DEVICES

(71) Applicant: International Business Machines Corporation, Armonk, NY (US)

(72) Inventors: Thomas W. Dyer, Pleasant Valley, NY (US); Stephen E. Greco, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 376 days.

(21) Appl. No.: 13/680,139

(22) Filed: Nov. 19, 2012

(65) Prior Publication Data

US 2014/0139236 A1    May 22, 2014

(51) Int. Cl.
*H01L 23/52*        (2006.01)
*G01R 35/00*        (2006.01)
*H01L 21/66*        (2006.01)

(52) U.S. Cl.
CPC ............... *G01R 35/00* (2013.01); *H01L 22/34* (2013.01)

(58) Field of Classification Search
CPC .............................. G01R 35/00; H01L 22/34
USPC .................... 324/601; 257/207, 208
See application file for complete search history.

(56) References Cited

U.S. PATENT DOCUMENTS

| | | |
|---|---|---|
| 5,777,486 A | 7/1998 | Hsu |
| 6,403,389 B1 | 6/2002 | Chang et al. |
| 6,423,555 B1 | 7/2002 | Babcock |
| 6,897,476 B1 | 5/2005 | Kim et al. |
| 7,089,516 B2 | 8/2006 | Arora et al. |
| 7,557,449 B2 | 7/2009 | Liu |
| 7,935,965 B1 * | 5/2011 | Brozek ......................... 257/48 |
| 8,115,276 B2 | 2/2012 | Zhang et al. |
| 8,174,011 B2 * | 5/2012 | Oshida ........................ 257/48 |
| 2009/0294904 A1 * | 12/2009 | Zhang et al. ................. 257/532 |
| 2012/0104622 A1 * | 5/2012 | Kim et al. .................... 257/774 |

\* cited by examiner

*Primary Examiner* — Jermele M Hollington
*Assistant Examiner* — Farhana Hoque
(74) *Attorney, Agent, or Firm* — L. Jeffrey Kelly; Catherine Ivers

(57) ABSTRACT

A test layout structure including a first series of parallel metal lines in a first level, and a first series of contact structures in a second level, the second level being positioned above the first level, the first series of contact structures being positioned at known increments, where the increments are in a direction perpendicular to a length of the first series of parallel metal lines, and where one or more of the first series of contact structures is in electrical contact with one or more of the first series of parallel metal lines.

19 Claims, 19 Drawing Sheets

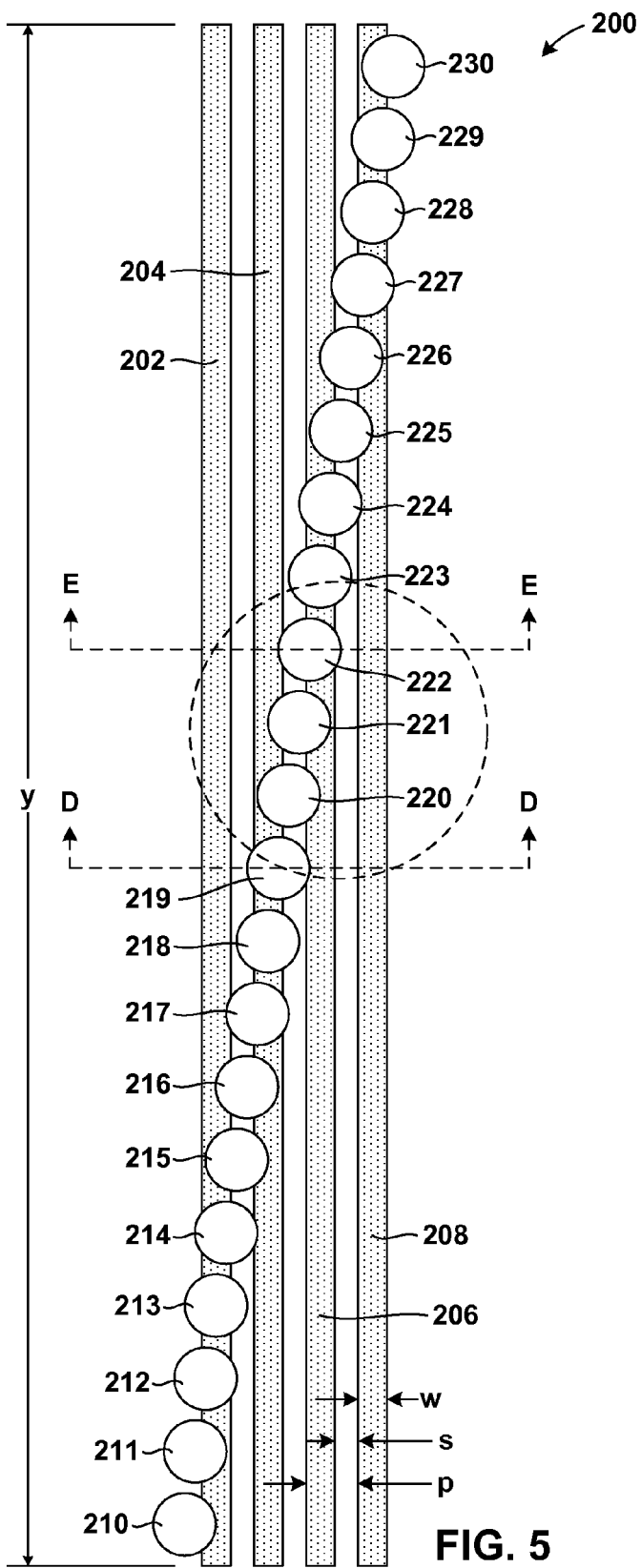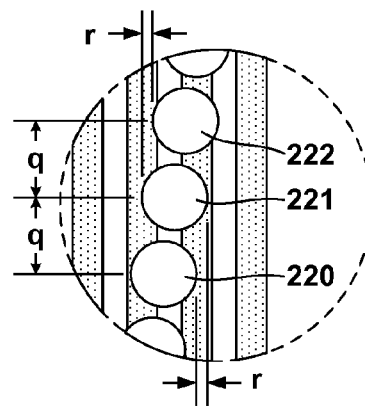
FIG. 5
FIG. 5A

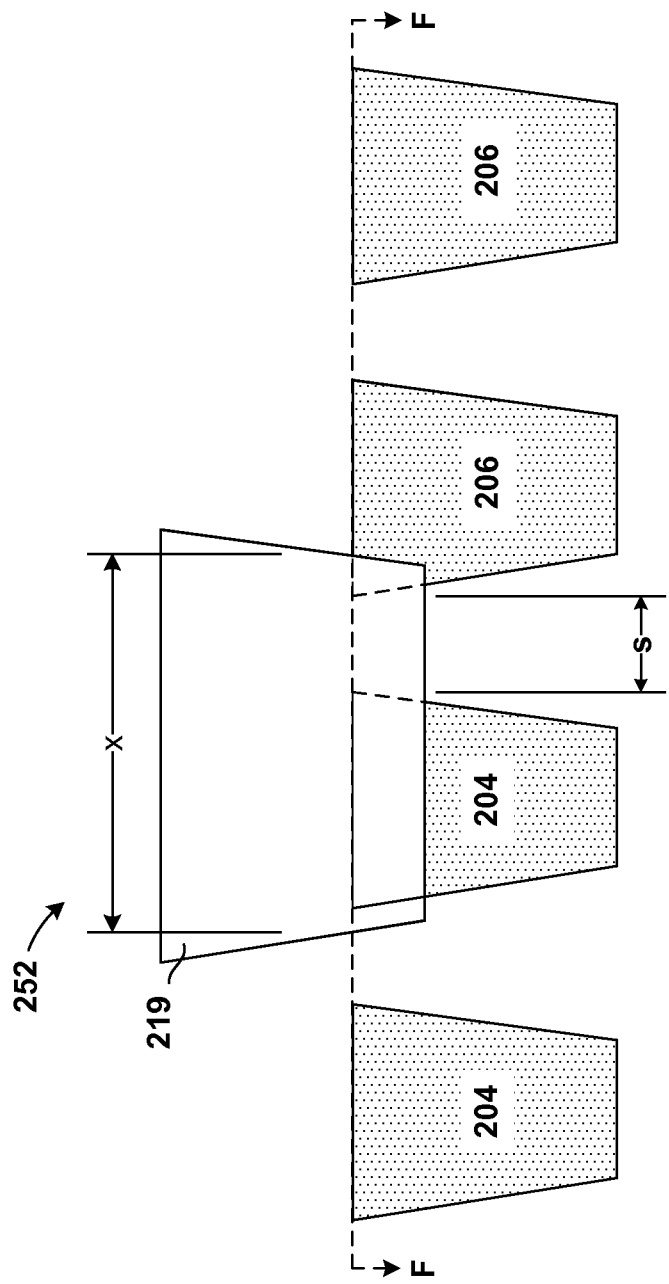

MEASURING METAL LINE SPACING IN SEMICONDUCTOR DEVICES

BACKGROUND

1. Field of the Invention

The present invention generally relates to integrated circuits, and more particularly to measuring the spacing between metal lines.

2. Background of Invention

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Metallization layers are usually the top-most layers of semiconductor devices. The manufacturing of semiconductor devices is typically classified into two phases, the front end of line (FEOL) and the back end of line (BEOL). The BEOL is typically considered to be the point of the manufacturing process where metallization layers are formed, and FEOL is considered to include the manufacturing processes prior to the formation of metallization layers, and where active devices are formed.

While some integrated circuits have a single top layer of metallization, other integrated circuits comprise multi-level interconnects, wherein two or more metallization layers are formed over a semiconductor wafer or workpiece. Each metallization layer typically comprises a plurality of metal lines separated from one another by an insulating material, also referred to as an inter-level dielectric (ILD). The metal lines in immediately neighboring horizontal metallization layers may be connected vertically in predetermined places by vias formed between the metal lines.

One of the characteristics affecting the reliability of semiconductor devices may be the top-to-top spacing ("spacing") between metal lines. The spacing may be defined as the distance between two adjacent metal lines as measured from the edges. Therefore, it may be desirable to measure the spacing between metal lines on every die. Current methods of obtaining the spacing measurement may include scanning electron microscope (SEM) inspection and electrical testing. The SEM inspection may take valuable time during fabrication, and the electrical testing may not provide accurate and repeatable results.

Any SEM inspection may occur immediately after a polishing technique, but before a dielectric cap may be deposited on top of the metallization layer being inspected. Further, SEM inspection may take an unacceptable amount of time during fabrication, delaying the formation of the dielectric cap and allowing copper dendrites to grow on the exposed metal lines. The copper dendrites may ultimately affect the reliability of the semiconductor device.

Also, electrical measuring techniques known in the art may be used to obtain the spacing measurement. Current electrical measurement techniques may include capacitance and resistance measurements. Capacitance measurement results may, however, be difficult to interpret because they are affected by the height and sidewall angle of the metal lines as well as the spacing. Similar difficulties may be experienced with resistance measurements.

Therefore, a need exists for a method to accurately obtain the spacing between metal lines without the difficulties identified above.

SUMMARY

One solution to the problem described above may include applying known electrical measuring techniques to a novel test layout having known characteristics and fabricated alongside of a production structure. The metal line spacing may be calculated from the result of the electrical testing and the known characteristics of the test layout.

According to one embodiment of the present invention, a test layout structure is provided. The test layout structure may include a first series of parallel metal lines in a first level, and a first series of contact structures in a second level, the second level being positioned above the first level, the first series of contact structures being positioned at known increments, where the increments are in a direction perpendicular to a length of the first series of parallel metal lines, and where one or more of the first series of contact structures is in electrical contact with one or more of the first series of parallel metal lines.

According to another exemplary embodiment, a method of measuring the line spacing between the top of two parallel metal lines is provided. The method of measuring the line spacing between the top of two parallel metal lines may include measuring the resistance between a first series of contact structures and two or more of a first series of parallel metal lines of a test layout, the first series of contact structures being positioned at known increments, wherein the increments are in a direction perpendicular to a length of the first series of parallel metal lines, and determining a line spacing measurement based on parameters obtained from measuring the resistance and known physical parameters of the test layout.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 5 depicts a test layout used to measure the metal line spacing of a microelectronic structure according to an exemplary embodiment.

FIG. 5A depicts a section view of FIG. 5 according to an exemplary embodiment.

FIG. 6 depicts a cross section view, section D-D, of FIG. 5 according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it will be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

As set forth herein, a function of this invention is to determine the distance between adjacent metal lines, or line spacing, of a semiconductor device. A test layout having a plurality of metal lines and a plurality of contact structures may be used to obtain the line spacing measurement. The test layout may include any one of a number of configurations, and may be chosen to simulate a production layout for which the line spacing measurement is desired. One test layout which may be used to measure metal line spacing is described in detail below by referring to the accompanying drawings in FIGS. 1-4. In this particular embodiment, a test structure in which the line spacing may be larger than the contact structure width may be described in conjunction with a corresponding measurement technique.

Figures 1, 1A:
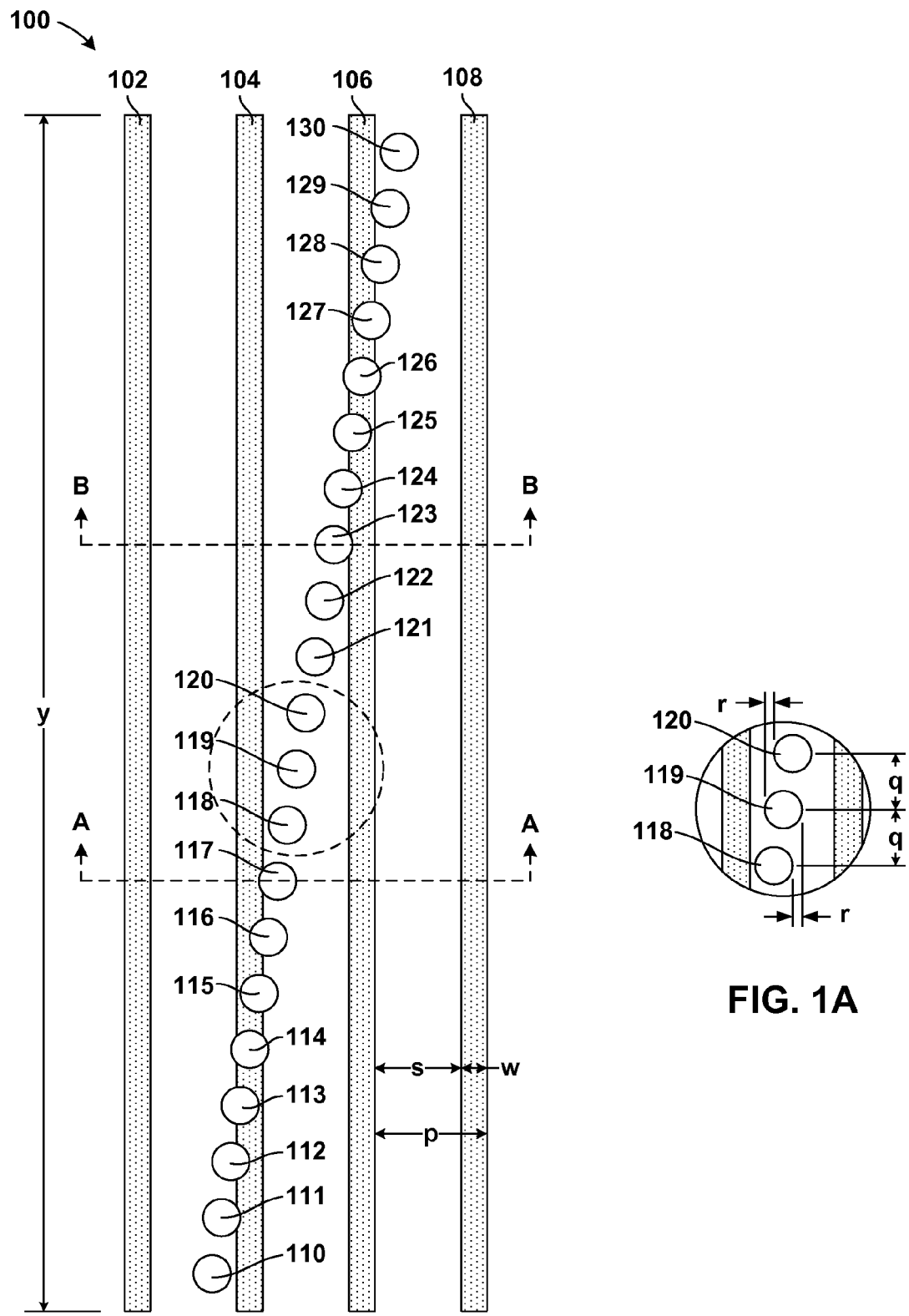
FIG. 1 depicts a test layout used to measure the metal line spacing of a microelectronic structure according to an exemplary embodiment.
FIG. 1A depicts a section view of FIG. 1 according to an exemplary embodiment.

Referring now to FIG. 1, a cross section view of a first macro design layout 100 ("first layout 100") is depicted. The first layout 100 may include a plurality of metal lines 102-108 located in a first level and a plurality of contact structures located in a second level with the first level being positioned below the second level. The contact structures may include a series of vias 110-130. Some of the series of vias 110-130 may be in electrical contact with some of the plurality of metal lines 102-108. For example the vias 111-117 may be in electrical contact with the metal line 104, and the vias 123-129 may be in electrical contact with the metal line 106. Furthermore, any number of contact structures may be used; however, a minimum number of contact structures may be required to obtain a measurement. The minimum number of contact structures required may depend on the line pitch and the contact structure size, as described in detail below.

In one embodiment, the vias 110-130 may all be the same size while being evenly spaced apart from one another along the length of the metal lines 102-108. For example, as shown in the section view depicted in FIG. 1A, the via 119 may be spaced by a distance (q) from the via 120 in the direction parallel to the metal lines 102-108. The distance (q) may be measured from the center of one via to the center of an adjacent via, as shown in the figure. It should be noted that even spacing between the vias 110-130 in the direction parallel with the metal lines 102-108 may be preferred, however other embodiments in which the via spacing in the direction parallel to the metal lines 102-108 is not even are explicitly contemplated Also, each of the vias 110-130 may have a unique incremental position along a direction perpendicular to the metal lines 102-108. For example, as shown in the section view depicted in FIG. 1A, the via 120 may be incrementally spaced by a distance (r) from the via 119, and the via 119 may be incrementally spaced by the same distance (r) from the via 118. The distance (r) may be measured from the leading edge of one via to the leading edge of an adjacent via, as shown in the figure. The incremental distance (r) may be equal to one unit of measurement. It may be recognized by one skilled in the art that the accuracy of the line spacing measurement may increase as the unit of measurement decreases. All the vias 110-130 may be incrementally spaced by the same unit of measurement. For example, all of the vias in the series may be spaced by a distance (r) in a direction perpendicular to the metal lines 102-108. In one embodiment, a single unit of measurement may be equal to 1 nm. Therefore, one skilled in the art may be able to calculate a distance perpendicular to the metal lines 102-108 between two vias based a particular number of vias. For example, the distance measured perpendicular to the metal lines 102-108 between the center of the via 110 and the center of the via 130 is 20 units, or 20 nm.

The metal lines 102-108 may be designed with a common width (w) and a common pitch (p), and may therefore be evenly spaced apart from one another. The pitch (p) of the metal lines may be equal to one line width (w) plus the spacing (s) between two adjacent metal lines. It may be noted that the width (w) of the metal lines 102-108 and the metal line spacing (s), as depicted in FIG. 1, corresponds to the width and spacing measured at a top surface of the metal lines 102-108. The metal line spacing (s) may be equal to the distance between to adjacent metal lines, as depicted in the figures. The metal lines 102-108 may be any suitable length (y), however, a minimum length may be required as determined by the size and spacing of the contact structures, for example the vias 110-130. The via size (x) (shown in FIG. 2) may preferably be about equal to the metal line width (w), however a via size (x) larger or smaller than the metal line width (w) may be contemplated. In the present embodiment, the via size (x) may be less than the metal line spacing (s). A scenario in which the via size (x) may be greater than the metal line spacing (s) is described in detail below with reference to FIGS. 5-8.

Figure 2:
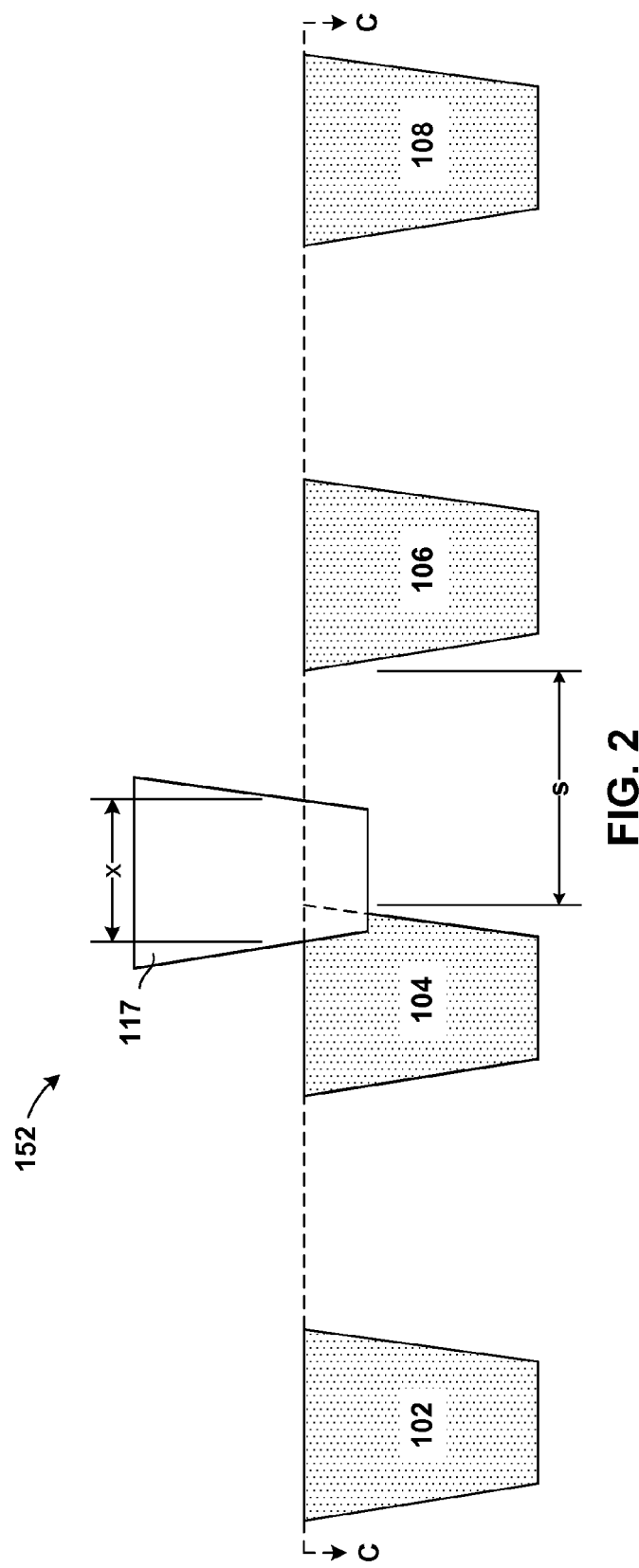
FIG. 2 depicts a cross section view, section A-A, of FIG. 1 according to an exemplary embodiment.

Referring now to FIG. 2, a cross sectional view of FIG. 1, section A-A, is shown. FIG. 2 depicts a first via orientation 152 in which the via 117 may be in electrical contact with the metal line 104. The size of the via 117, for example (x), may be measured at the intersection with the plane defined by the top surface of the metal lines 104 and 106. Generally, the contact structures, for example the vias 110-130, may be designed to extend from a top surface of the second level to a location below the top surface of the metal lines 102-108 to ensure electrical contact between the vias and the metal lines may be achieved. The dimension (x) may be used as the via size because the desired line spacing measurement, for example (s), shall be measured along a plane defined by the top surface of the metal lines 102-108. It should be noted that the first and second levels are omitted from FIG. 2 for illustrative purposes only.

Figure 3:
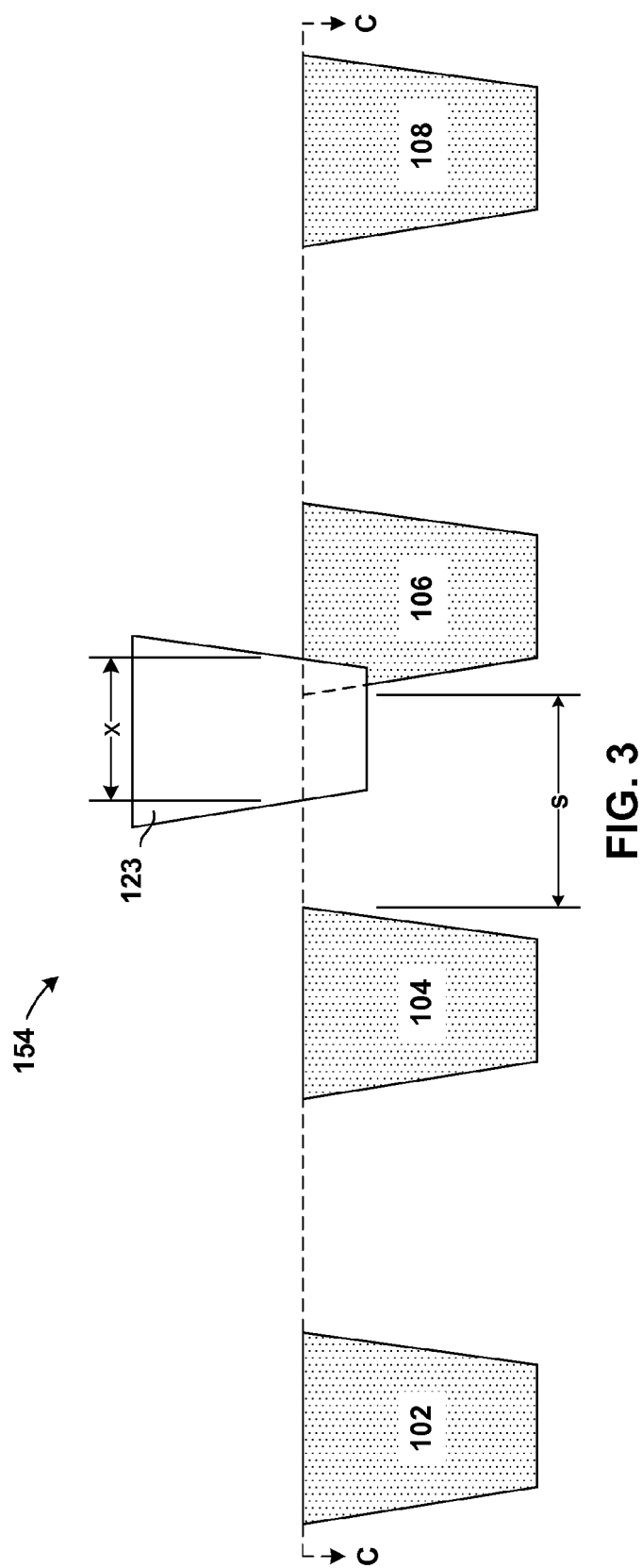
FIG. 3 depicts a cross section view, section B-B, of FIG. 1 according to an exemplary embodiment.

Referring now to FIG. 3, a cross sectional view of FIG. 1, section B-B, is shown. FIG. 3 depicts a second via orientation 154 in which the via 123 may be in electrical contact with the metal line 106. Like in FIG. 2, the dimension (x) may represent the size of the via 123, and the dimension (s) may represent the spacing (s) between metal lines 104 and 106. It should be noted that the first and second levels are also omitted from FIG. 3 for illustrative purposes only. It should also be noted, for further clarification and understanding, that FIG. 1 represents a cross sectional view of FIGS. 2 and 3, section C-C.

Figure 4:
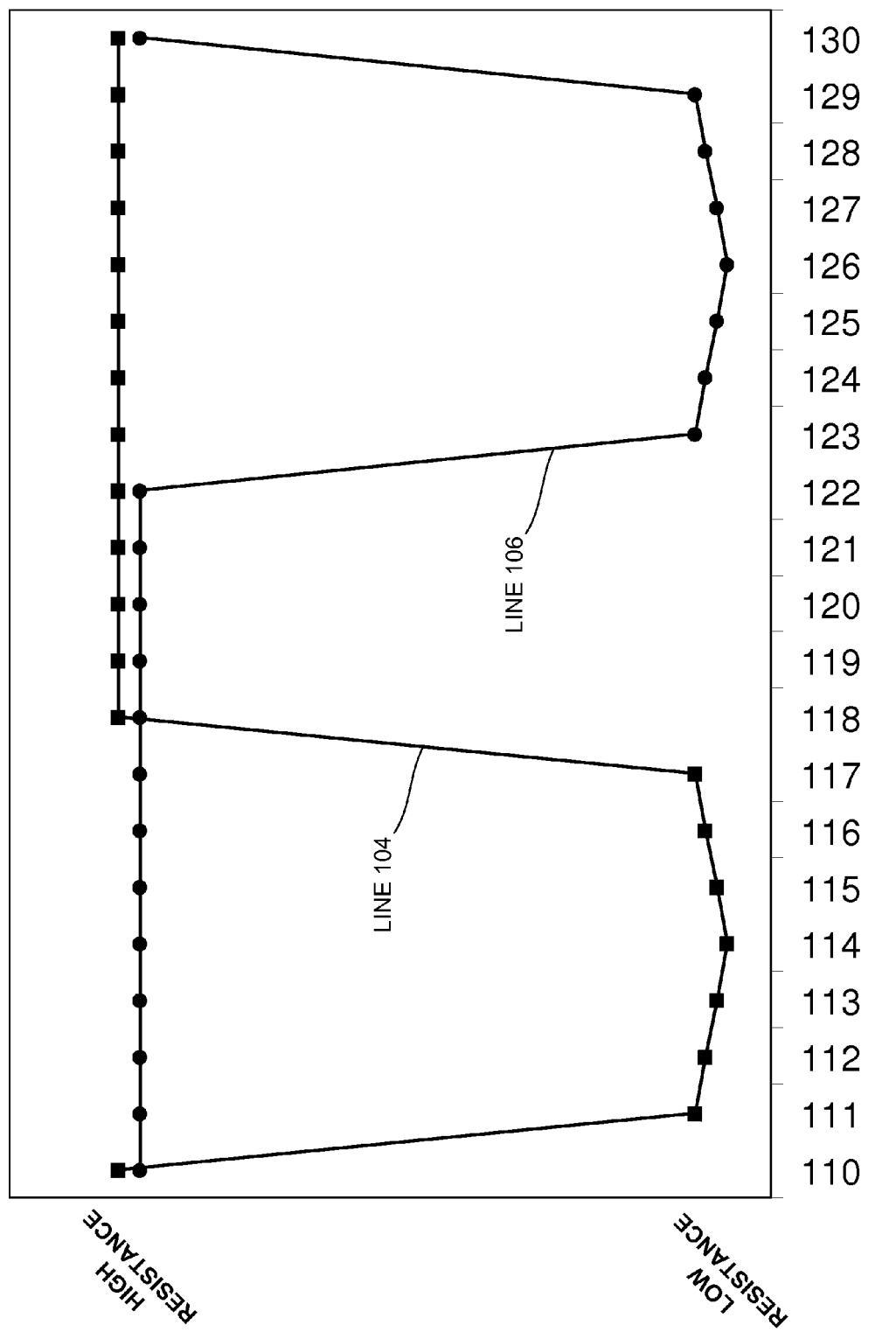
FIG. 4 depicts test data after conducting continuity testing on the test layout of FIG. 1 according to an exemplary embodiment.

Referring now to FIG. 4, a chart depicting electrical continuity measurements between the vias 110-130 and metal lines 104 and 106. Known techniques may be used to make electrical contact with both metal lines 104 and 106 and the vias 110-130. In one embodiment, an additional structure, for example a via, may be formed above each metal line which may be used to make electrical contact to the corresponding metal line for continuity testing. In one embodiment, electrical contact may be made directly to the vias 110-130 for continuity testing. The electrical continuity measurement may be depicted along the y, or vertical, axis of the chart and may be characterized generally as "high resistance" and "low resistance." High resistance may indicate no electrical continuity, or lack of an electrical connection between the corresponding via and metal line. Low resistance may indicate electrical continuity or the existence of an electrical connection between the corresponding via and metal line. The via number may be depicted along the x, or the horizontal, axis of the chart, and the metal lines may be represented by the two distinct line plots, as labeled in the figure.

The chart provides data regarding which vias may be electrically connected to which metal lines. For example, reading the line plot for the metal line 104, the vias 111-117 may have low resistance measurements, and therefore may be in electrical contact with the metal line 104. Conversely, the vias 110, and 118-130 may have high resistance measurements, and therefore may not be in electrical connection with the metal line 104. Similarly, reading the line plot for the metal line 106, the vias 123-129 may have low resistance measurements, and therefore may be in electrical connection with the metal line 106. Conversely, the vias 110-122, and 130 may have high resistance measurements, and therefore may not be in electrical connection with the metal line 106.

A measurement procedure for the metal line spacing of the first layout 100, for example (s) according to one embodiment, will now be described in detail below. It should be noted that the current measurement procedure will incorporate the use of the first layout 100 in which the contact structures are smaller than the line spacing (s). In such scenarios the line spacing (s) may be determined by the following equation, $$s = x + [i \times r]$$

where (x) is the contact structure size, (r) is the known translational increment, and (i) is the number of translational increments between the first via orientation 152 (shown in FIG. 2) and the second via orientation 154 (shown in FIG. 3).

In one embodiment, the value of (x) may be equal to the size of the via as described above. Via size may be independently determined using known techniques, for example, a four point probe measurement. Such measurements may be carried out on an isolated via structure separate from the first layout 100. Generally, the four point probe measurement yields values of resistance of which there is a known correlation between resistance and via size. The known translational increment (r), as shown in FIG. 1A, may be a design constraint of the first layout 100. As described above, the series of contact structures, for example the vias 110-130, may be incrementally positioned relative to one another along a direction perpendicular to the metal lines 102-108. The number of incremental shifts (i) may be determined by conducting continuity testing between two adjacent metal lines, and the series of contact structures. The number of incremental shifts (i) may be the number of increments between the first via orientation 152 and the second via orientation 154. The results of the continuity testing will indicate which contact structures, for example the vias 110-130, are in electrical contact with which metal lines, for example the metal lines 102-108.

First, continuity testing may be conducted between two adjacent metal lines, for example the metal lines 104 and 106, and the series of contact structures, for example the vias 110-130. The results of the continuity test may be depicted in a chart, for example the chart depicted in FIG. 4. Using the chart, the number of increments between the first via orientation 152 (shown in FIG. 2) and the second via orientation 154 (shown in FIG. 3) may be determined. For example, as provided in FIG. 4, the via 117 is the contact structure that corresponds with the first via orientation 152, and the via 123 is the contact structure that corresponds with the second via orientation 154. Therefore, there is 6 incremental shifts between the via 117 and the via 123, and thus (i) may be equal to 6.

For example, assuming the known translational increment (r) is equal to 1 nm and the via size (x) is equal to 40 nm the line spacing (s) may be calculated using the above formula. It should be noted that the translational increment and the via size are estimated in this example for illustrative purposes only. The formula is as follows:

$$s = 40 \text{ nm} + [6 \times 1 \text{ nm}]$$

Therefore, based on the above example the line spacing (s) is equal to 46 nm. As described above, the number of contact structures required to obtain a metal line spacing measurement may depend on the size of the via and the pitch of the metal lines. At a minimum, the series of contact structures shall make electrical contact with two or more adjacent metal lines in order to obtain a measurement for the spacing between these metal lines. Measurements may not be accomplished in the event the series of vias only makes electrical contact to a single metal line. In the present embodiment, only seven vias, specifically vias 117-123, may be necessary to obtain a line spacing measurement, however the first layout 100 may include more than seven vias to eliminate a need for precisely locating the series of vias relative to the metal lines.

Another test layout which may be used to measure metal line spacing is described in detail below by referring to the accompanying drawings in FIGS. 5-8. In this particular embodiment, a test structure in which the line spacing may be smaller than the contact structure width may be described in conjunction with a corresponding measurement technique.

Referring now to FIG. 5, a cross section view of a second macro design layout 200 ("second layout 200") is depicted. The second layout 200 may include a plurality of metal lines 202-208 located in a first level and a plurality of contact structures located in a second level with the first level being positioned below the second level. The contact structures may include a series of vias 210-230. Some of the series of vias 210-230 may be in electrical contact with some of the plurality of metal lines 202-208. For example the vias 214-222 may be in electrical contact with the metal line 204, and the vias 219-227 may be in electrical contact with the metal line 206. Furthermore, any number of contact structures may be used; however, a minimum number of contact structures may be required to obtain a measurement. The minimum number of contact structures required may depend on the line pitch and the contact structure size, as described in detail below.

In one embodiment, the vias 210-230 may all be the same size while being evenly spaced apart from one another along the length of the metal lines 202-208. For example, as shown in the section view depicted in FIG. 5A, the via 221 may be spaced by a distance (q) from the via 222 in the direction parallel to the metal lines 202-208. The distance (q) may be measured from the center of one via to the center of an adjacent via, as shown in the figure. It should be noted that even spacing between the vias 210-230 in the direction parallel with the metal lines 202-208 may be preferred, however other embodiments in which the via spacing in the direction parallel to the metal lines 202-208 is not even are explicitly contemplated Also, each of the vias 210-230 may have a unique incremental position along a direction perpendicular to the metal lines 202-208. For example, as shown in the section view depicted in FIG. 5A, the via 222 may be incrementally spaced by a distance (r) from the via 221, and the via 221 may be incrementally spaced by the same distance (r) from the via 220. The distance (r) may be measured from the leading edge of one via to the leading edge of an adjacent via, as shown in the figure. The incremental distance (r) may be equal to one unit of measurement. It may be recognized by one skilled in the art that the accuracy of the line spacing measurement may increase as the unit of measurement decreases. All the vias 210-230 may be incrementally spaced by the same unit of measurement. For example, all of the vias in the series may be spaced by a distance (r) in a direction perpendicular to the metal lines 202-208. In one embodiment, a single unit of measurement may be equal to 1 nm. Therefore, one skilled in the art may be able to calculate a distance perpendicular to the metal lines 202-208 between two vias based a particular number of vias. For example, the distance measured perpendicular to the metal lines 202-208 between the center of the via 210 and the center of the via 230 is 20 units, or 20 nm.

The metal lines 202-208 may be designed with a common width (w) and a common pitch (p), and may therefore be evenly spaced apart from one another. The pitch (p) of the metal lines may be equal to one line width (w) plus the spacing (s) between two adjacent metal lines. It may be noted that the width (w) of the metal lines 202-208 and the metal line spacing (s), as depicted in FIG. 5, corresponds to the width and spacing measured at a top surface of the metal lines 202-208. The metal line spacing (s) may be equal to the distance between to adjacent metal lines, as depicted in the figures. The metal lines 202-208 may be any suitable length (y), however, a minimum length may be required as determined by the size and spacing of the contact structures, for example the vias 210-230. The via size (x) (shown in FIG. 6) may preferably be about equal to the metal line width (w), however a via size (x) larger or smaller than the metal line width (w) may be contemplated. In the present embodiment, the via size (x) may be greater than the metal line spacing (s). The scenario in which the via size (x) may be less than the metal line spacing (s) is described in detail above with reference to FIGS. 1-4.

Referring now to FIG. 6, a cross sectional view of FIG. 5, section D-D, is shown. FIG. 6 depicts a first via orientation 252 in which the via 219 may be in electrical contact with the metal lines 204, 206. The size of the via 219, for example (x), may be measured at the intersection with the plane defined by the top surface of the metal lines 204 and 206. Generally, the contact structures, for example the vias 210-230, may be designed to extend from a top surface of the second level to a location below the top surface of the metal lines 202-208 to ensure electrical contact between the vias and the metal lines may be achieved. The dimension (x) may be used as the via size because the desired line spacing measurement, for example (s), shall be measured along a plane defined by the top surface of the metal lines 202-208. It should be noted that the first and second levels are omitted from FIG. 6 for illustrative purposes only.

Figure 7:
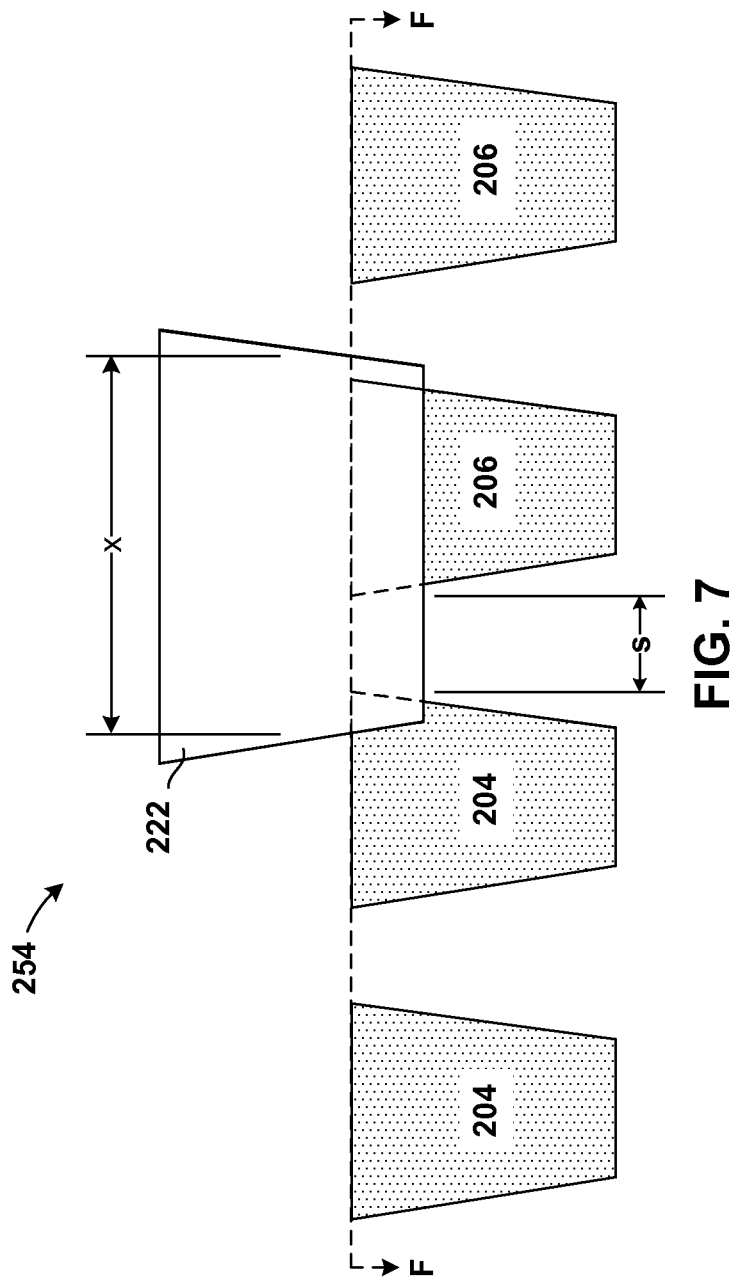
FIG. 7 depicts a cross section view, section E-E, of FIG. 5 according to an exemplary embodiment.

Referring now to FIG. 7, a cross sectional view of FIG. 5, section E-E, is shown. FIG. 7 depicts a second via orientation 254 in which the via 222 may be in electrical contact with the metal lines 204, 206. Like in FIG. 6, the dimension (x) may represent the size of the via 222, and the dimension (s) may represent the spacing (s) between metal lines 204 and 206. It should be noted that the first and second levels are also omitted from FIG. 7. It should also be noted, for further clarification and understanding, that FIG. 5 represents a cross sectional view of FIGS. 6 and 7, section F-F.

It should be noted that the first via orientation 252 may be chosen as the first via in the series to be in electrical contact with two adjacent metal lines (e.g. 204, 206). The second via orientation 254 may be chosen as the last via in the series to be in electrical contact with the same two adjacent metal lines (e.g. 204, 206). Furthermore, the first via orientation 252 and the second via orientation 254 may represent the vias 214, 217 with respect to the metal lines 202, 204, and the vias 224, 227 with respect to the metal lines 206, 208, respectively.

Figure 8:
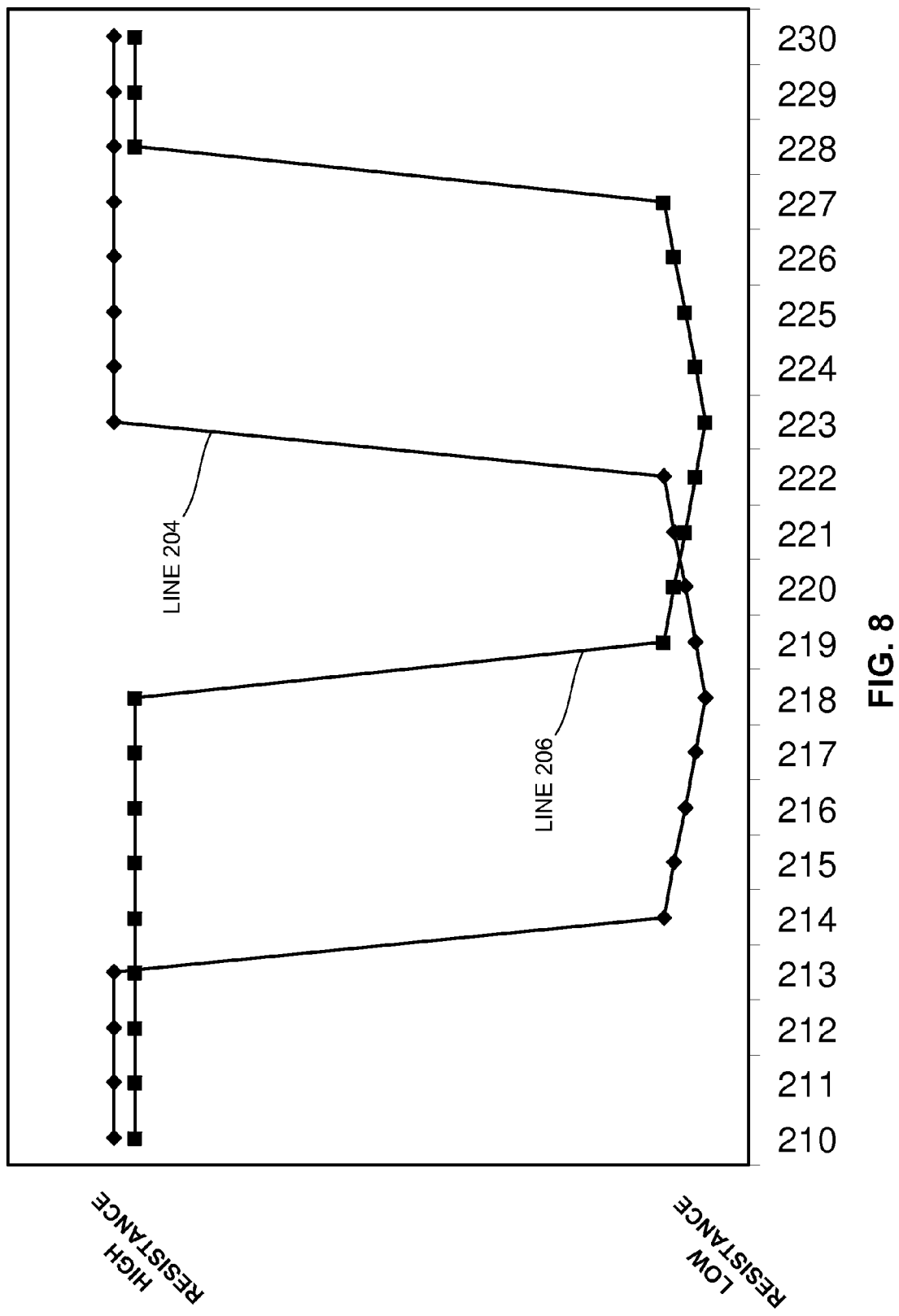
FIG. 8 depicts test data after conducting continuity testing on the test layout of FIG. 5 according to an exemplary embodiment.

Referring now to FIG. 8, a chart depicting electrical continuity measurements between the vias 210-230 and metal lines 204 and 206. Known techniques may be used to make electrical contact with both metal lines 204 and 206 and the vias 210-230. In one embodiment, an additional structure, for example a via, may be formed above each metal line which may be used to make electrical contact to the corresponding metal line for continuity testing. In one embodiment, electrical contact may be made directly to the vias 210-230 for continuity testing. The electrical continuity measurement may be depicted along the y, or vertical, axis of the chart and may be characterized generally as "high resistance" and "low resistance." High resistance may indicate no electrical continuity, or lack of an electrical connection between the corresponding via and metal line. Low resistance may indicate electrical continuity or the existence of an electrical connection between the corresponding via and metal line. The via number may be depicted along the x, or the horizontal, axis of the chart, and the metal lines may be represented by the two distinct line plots, as labeled in the figure.

The chart provides data regarding which vias may be electrically connected to which metal lines. For example, reading the line plot for the metal line 204, the vias 214-222 may have low resistance measurements, and therefore may be in electrical contact with the metal line 204. Conversely, the vias 210-213 and 223-230 may have high resistance measurements, and therefore may not be in electrical connection with the metal line 204. Similarly, reading the line plot for the metal line 206, the vias 219-227 may have low resistance measurements, and therefore may be in electrical connection with the metal line 206. Conversely, the vias 210-218, and 228-230 may have high resistance measurements, and therefore may not be in electrical connection with the metal line 206.

A measurement procedure for the metal line spacing of the test layout 200, for example (s) according to one embodiment, will now be described in detail below. It should be noted that the current measurement procedure will incorporate the use of the second layout 200 in which the contact structures are larger than the line spacing (s). In such scenarios the line spacing (s) may be determined by the following equation, $$s = x - [i \times r]$$

where (x) is the contact structure size, (r) is the known translational increment, and (i) is the number of translational increments between the first via orientation 252 (shown in FIG. 6) and the second via orientation 254 (shown in FIG. 7).

In one embodiment, the value of (x) may be equal to the size of the via as described above. Via size may be independently determined using known techniques, for example, a four point probe measurement. Such measurements may be carried out on an isolated via structure separate from the second layout 200. Generally, the four point probe measurement yields values of resistance of which there is a known correlation between resistance and via size. The known translational increment (r), as shown in FIG. 5A, may be a design constraint of the second layout 200. As described above, the series of contact structures, for example the vias 210-230, may be incrementally positioned relative to one another along a direction perpendicular to the metal lines 202-208. The number of incremental shifts (i) may be determined by conducting continuity testing between two adjacent metal lines, and the series of contact structures. The number of incremental shifts (i) may be the number of increments between the first via orientation 252 and the second via orientation 254. The results of the continuity testing will indicate which contact structures, for example the vias 210-230, are in electrical contact with which metal lines, for example the metal lines 202-208.

First, continuity testing may be conducted between two adjacent metal lines, for example the metal lines 204 and 206, and the series of contact structures, for example the vias 210-230. The results of the continuity test may be depicted in a chart, for example the chart depicted in FIG. 8. Using the chart, the number of increments between the first via orientation 252 (shown in FIG. 6) and the second via orientation 254 (shown in FIG. 7) may be determined. For example, as provided in FIG. 8, the via 219 is the contact structure that corresponds with the first via orientation 252, and the via 222 is the contact structure that corresponds with the second via orientation 254. Therefore, there is 3 incremental shifts between the via 219 and the via 222, and thus (i) may be equal to 3.

For example, assuming the known translational increment (r) is equal to 1 nm and the via size (x) is equal to 40 nm the line spacing (s) may be calculated using the above formula. It should be noted that the translational increment and the via size are estimated in this example for illustrative purposes only. The formula is as follows:

$$s = 40 \text{ nm} - [5 \times 1 \text{ nm}]$$

Therefore, based on the above example the line spacing (s) is equal to 35 nm. As described above, the number of contact structures required to obtain a metal line spacing measurement may depend on the size of the via and the pitch of the metal lines. At a minimum, the series of contact structures shall make electrical contact with two or more adjacent metal lines in order to obtain a measurement for the metal line spacing. Measurements may not be accomplished in the event the series of vias only makes electrical contact to a single metal line. In the present embodiment, only four vias, specifically vias 219-222, may be necessary to obtain a line spacing measurement, however the second layout 200 may include more than four vias to eliminate a need for precisely locating the series of vias relative to the metal lines.

Another test layout which may be used to measure metal line spacing is described in detail below by referring to the accompanying drawings in FIGS. 9-12. In this particular embodiment, a test structure in which the contact structures may extend across, and contact, multiple metal lines having a common line pitch and a common line spacing may be described in conjunction with a corresponding measurement technique.

Figure 9:
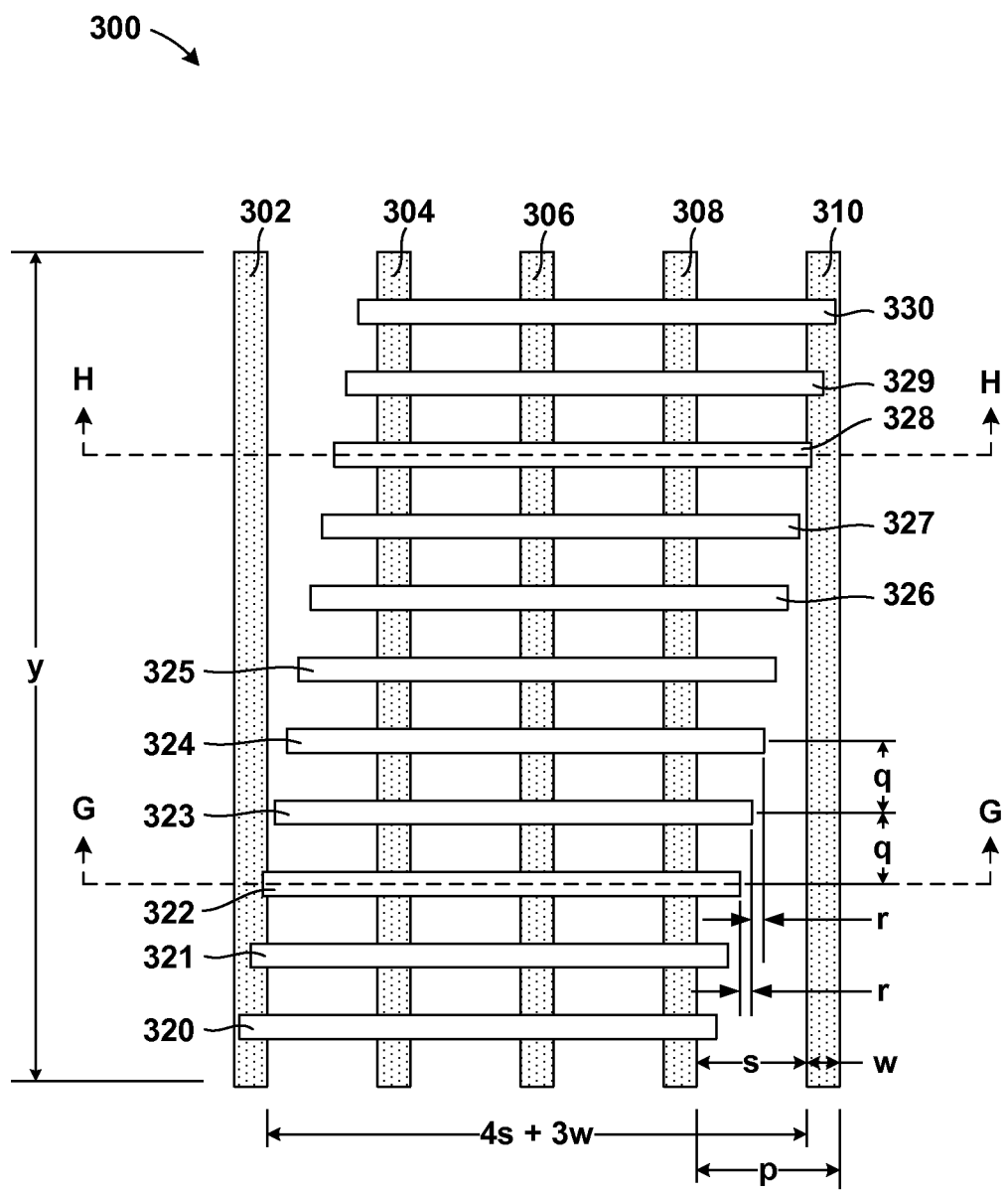
FIG. 9 depicts a test layout used to measure the metal line spacing of a microelectronic structure according to an exemplary embodiment.

Referring now to FIG. 9, a cross section view of a third macro design layout 300 ("third layout 300") is depicted. The third layout 300 may include a plurality of metal lines 302-310 located in a first level and a plurality of contact structures located in a second level with the first level being positioned below the second level. The contact structures may include a series of via bars 320-330. Some of the series of via bars 320-330 may be in electrical contact with some of the plurality of metal lines 302-310. For example the via bars 320-322 may be in electrical contact with the metal line 302, and the via bars 328-330 may be in electrical contact with the metal line 310. Furthermore, any number of contact structures may be used; however, a minimum number of contact structures may be required to obtain a measurement. The minimum number of contact structures required may depend on the line pitch and the contact structure size, as described in detail below.

In one embodiment, the via bars 320-330 may all be the same width and length while being evenly spaced apart from one another along the length of the metal lines 302-310. For example, as shown in the figure, the via bar 324 may be spaced by a distance (q) from the via bar 323 in the direction parallel to the metal lines 302-310. The distance (q) may be measured from the center of one via bar to the center of an adjacent via bar, as shown in the figure. It should be noted that even spacing between the via bars 320-330 in the direction parallel with the metal lines 302-310 may be preferred, however other embodiments in which the via bar spacing in the direction parallel to the metal lines 302-310 is not even are explicitly contemplated Also, each of the via bars 320-330 may have a unique incremental position along a direction perpendicular to the metal lines 302-310. For example, as shown in figure, the via bar 324 may be incrementally spaced by a distance (r) from the via bar 323, and the via bar 323 may be incrementally spaced by the same distance (r) from the via bar 322. The distance (r) may be measured from the leading edge of one via bar to the leading edge of an adjacent via bar, as shown in the figure. The incremental distance (r) may be equal to one unit of measurement. It may be recognized by one skilled in the art that the accuracy of the line spacing measurement may increase as the unit of measurement decreases. All the via bars 320-330 may be incrementally spaced by the same unit of measurement. For example, all of the via bars in the series may be spaced by a distance (r) in a direction perpendicular to the metal lines 302-310. In one embodiment, a single unit of measurement may be equal to 1 nm. Therefore, one skilled in the art may be able to calculate a distance perpendicular to the metal lines 302-310 between two via bars based a particular number of via bars. For example, the distance measured perpendicular to the metal lines 302-310 between the center of the via bar 320 and the center of the via bar 330 is 10 units, or 10 nm.

The metal lines 302-310 may be designed with a common width (w) and a common pitch (p), and may therefore be evenly spaced apart from one another. The pitch (p) of the metal lines may be equal to one line width (w) plus the spacing (s) between two adjacent metal lines. It may be noted that the width (w) of the metal lines 302-310 and the metal line spacing (s), as depicted in FIG. 9, corresponds to the width and spacing measured at a top surface of the metal lines 302-310. The metal line spacing (s) may be equal to the distance between to adjacent metal lines, as depicted in the figures. The metal lines 302-310 may be any suitable length (y), however, a minimum length may be required as determined by the size and spacing of the contact structures, for example the via bars 320-330. In one embodiment, the via bar length (x) (shown in FIG. 10) may be equal to about 3.5 times the line pitch (p), however a via bar length (x) larger or smaller than 3.5 times the line pitch (p) may be contemplated.

Figure 10:
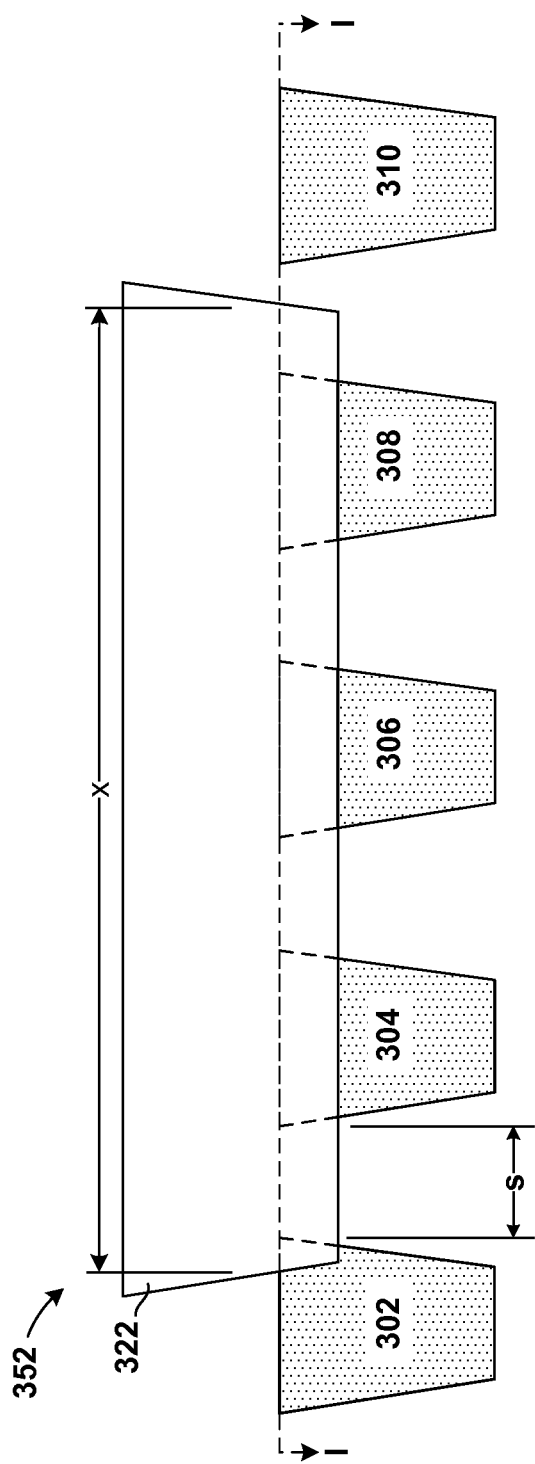
FIG. 10 depicts a cross section view, section G-G, of FIG. 9 according to an exemplary embodiment.

Referring now to FIG. 10, a cross sectional view of FIG. 9, section G-G, is shown. FIG. 10 depicts a first via orientation 352 in which the via bar 322 may be in electrical contact with the metal lines 302, 304, 306, 308. The length of the via bar 322, for example (x), may be measured at the intersection with the plane defined by the top surface of the metal lines 302, 304, 306, 308. Generally, the contact structures, for example the via bars 320-330, may be designed to extend from a top surface of the second level to a location below the top surface of the metal lines 302-310 to ensure electrical contact between the via bars and the metal lines may be achieved. The dimension (x) may be used as the via bar length because the desired line spacing measurement, for example (s), shall be taken along a plane defined by the top surface of the metal lines 302-310. It should be noted that the first and second levels are omitted from FIG. 10 for illustrative purposes only.

Figure 11:
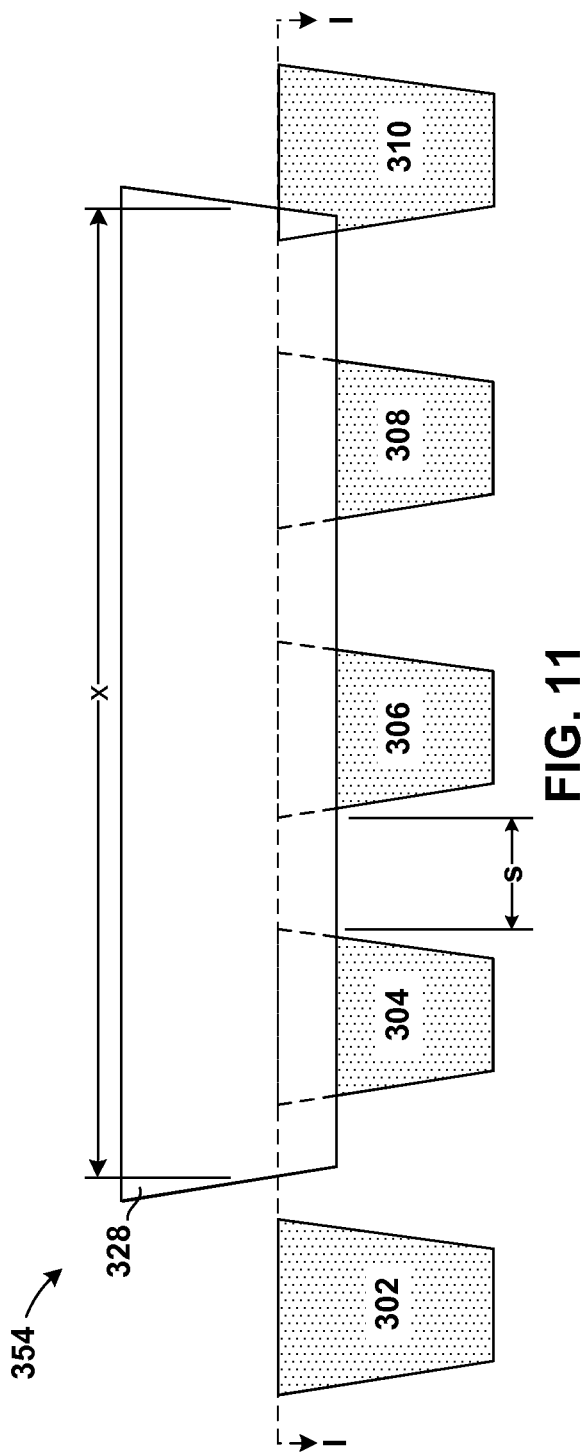
FIG. 11 depicts a cross section view, section H-H, of FIG. 9 according to an exemplary embodiment.

Referring now to FIG. 11, a cross sectional view of FIG. 9, section H-H, is shown. FIG. 11 depicts a second via orientation 354 in which the via bar 328 may be in electrical contact with the metal lines 304, 306, 306, 308. Like in FIG. 10, dimension (x) may represent the size of the via bar 328, and the dimension (s) may represent the spacing (s) between metal lines. It should be noted that the first and second levels are also omitted from FIG. 11 for illustrative purposes only. It should also be noted, for clarification and understanding, that FIG. 9 represents a cross sectional view of FIGS. 10 and 11, section I-I.

Figure 12:
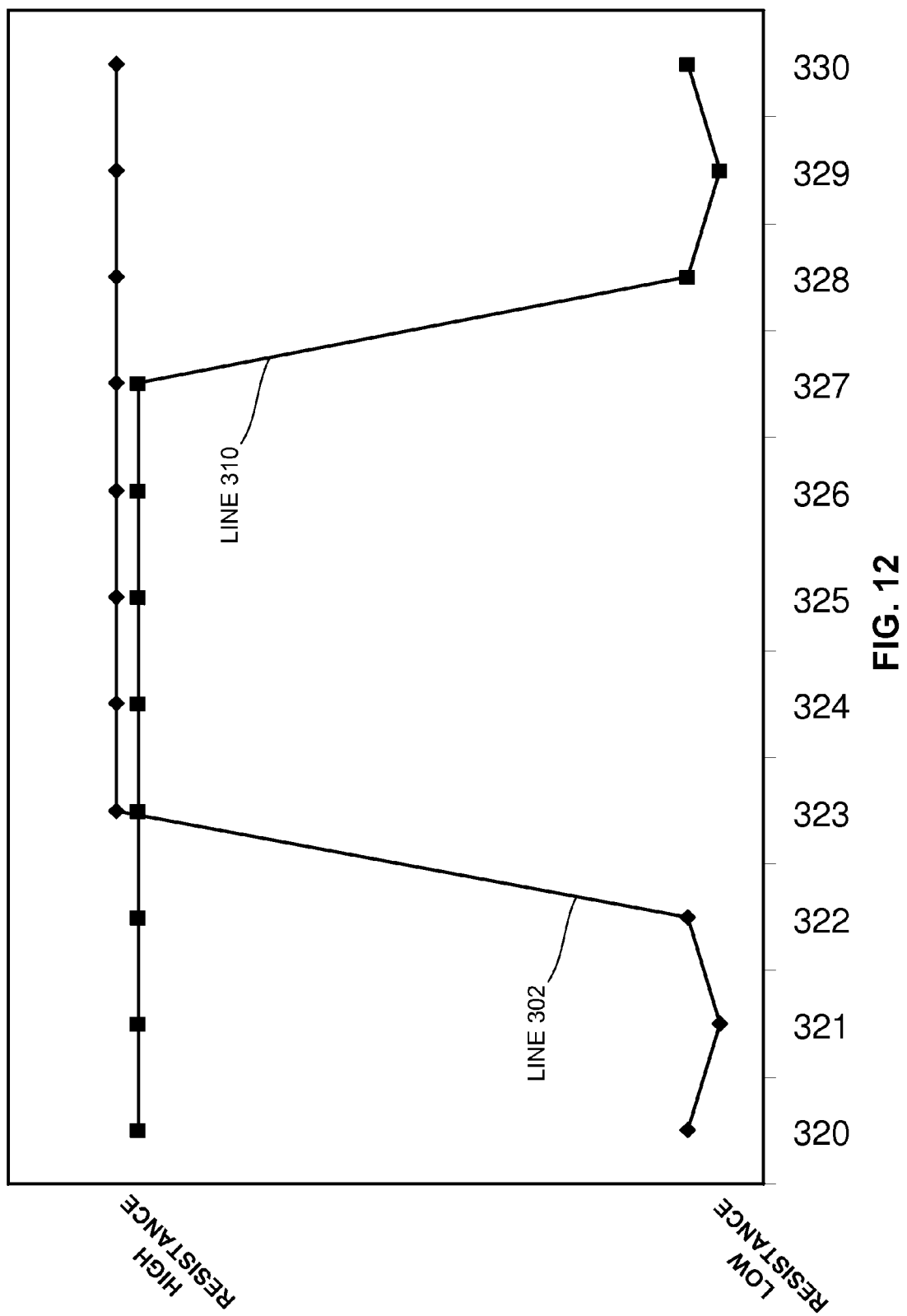
FIG. 12 depicts test data after conducting continuity testing on the test layout of FIG. 9 according to an exemplary embodiment.

Referring now to FIG. 12, a chart depicting electrical continuity measurements between the vias 320-330 and metal lines 302 and 310. Known techniques may be used to make electrical contact with both metal lines 302 and 310 and the vias 320-330. In one embodiment, an additional structure, for example a via, may be formed above each metal line which may be used to make electrical contact to the corresponding metal line for continuity testing. In one embodiment, electrical contact may be made directly to the via bars 320-330 for continuity testing. The electrical continuity measurement may be depicted along the y, or vertical, axis of the chart and may be characterized generally as "high resistance" and "low resistance." High resistance may indicate no electrical continuity, or lack of an electrical connection between the corresponding via and metal line. Low resistance may indicate electrical continuity or the existence of an electrical connection between the corresponding via and metal line. The via bar number may be depicted along the x, or the horizontal, axis of the chart, and the metal lines may be represented by the two distinct line plots, as labeled in FIG. 12.

The chart provides data regarding which via bars may be electrically connected to which metal lines. In the present example, continuity may be measured between only the metal line 302 and the via bars 320-330, and between the metal line 310 and the via bars 320-330. For example, reading the line plot for the metal line 302, the via bars 320-322 may have low resistance measurements, and therefore may be in electrical contact with the metal line 302. Conversely, vias 323-330 may have high resistance measurements, and therefore may not be in electrical connection with the metal line 302. Similarly, reading the line plot for the metal line 310, the via bars 328-330 may have low resistance measurements, and therefore may be in electrical connection with the metal line 310. Conversely, the via bars 320-327 may have high resistance measurements, and therefore may not be in electrical connection with the metal line 310.

A measurement procedure for the metal line spacing of the third layout 300, for example (s), according to one embodiment, will now be described in detail below. It should be noted that the current measurement procedure will incorporate the use of the third layout 300 in which the contact structures are via bars that may span across, and make electrical contact with, multiple metal lines. In such scenarios the line spacing (s) may be determined by the following equation, $$x+ir=as+bw$$

where (x) is the contact structure length, (i) is the number of translational increments between the first via bar orientation 352 (shown in FIG. 10) and the second via bar orientation 354 (shown in FIG. 11), (r) is the known translational increment, (a) is the known number of spaces between the two metal lines measured for continuity, (s) is the line spacing, (b) is the known number of metal lines between the two lines measured for continuity, and (w) is the line width. The contact structure length (x), the line width (w), and the line spacing (s) are unknown. The number if translational increments (i), translational increment (r), the number of spaces between the two metal lines measured for continuity (a), and the number of number of metal lines between the two lines measured for continuity (b) may be determined by continuity testing.

With reference to FIG. 9, for example, the above equation may otherwise be derived in the following manner. The distance between the trailing edge of the metal line 302 and the leading edge of the metal line 310 may be equal to four line spaces (s) plus three line widths (w) as depicted in the figure. Similarly, the distance between the trailing edge of the metal line 302 and the leading edge of the metal line 310 may also equal to the contact structure length (x) plus the translational increment (r) times the number of translational increments (i) between the first via bar orientation 352 (shown in FIG. 10) and the second via bar orientation 354 (shown in FIG. 11). Therefore, the contact structure length (x) plus the translational increment (r) times the number of translational increments (i) may be equal to four line spaces (s) plus three line widths (w) which is the formula above, or alternatively written as:

$$x+ir=4s+3w$$

Furthermore, the known translational increment (r), as shown in FIG. 9, may be a design constraint of the third layout 300, and thus known. As described above, the series of contact structures, for example the via bars 320-330, may be incrementally positioned relative to one another along a direction perpendicular to the metal lines 302-310. The number of incremental shifts (i) may be determined by conducting continuity testing between two metal lines and the series of contact structures. The results of the continuity testing will indicate which contact structures, for example the via bars 320-330, are in electrical contact with which metal lines, for example the metal lines 302-310.

First, continuity testing may be conducted between two metal lines, for example the metal lines 302 and 310, and the series of contact structures, for example via bars 320-330. The results of the continuity testing may be depicted in a chart, for example the chart depicted in FIG. 12. Using the chart, the number of increments between the first via orientation 352 (shown in FIG. 10) and the second via orientation 354 (shown in FIG. 11) may be determined. For example, as provided in FIG. 12, the via bar 322 is the contact structure that corresponds with the first via orientation 352, and the via bar 328 is the contact structure that corresponds with the second via orientation 354. Therefore, according to the layout 300, there are 6 incremental shifts between the via bar 322 and the via bar 328, and thus (i) may be equal to 6.

After continuity testing the number of translational increments (i) may be known. The contact structure length (x), the line width (w), and the line spacing (s) remain unknown. Assuming the translational increment (r) to may be 1 nm the equation corresponding to the layout 300 may be written as follows:

$$x+(1)(6)=4s+3w$$

The contact structure length (x) may be required to solve the above equation for the line spacing (s). In one embodiment, the contact structure length (x) may be equal to about 3.5 times the metal line pitch as described above, however any contact structure length may be used. Furthermore, the actual contact structure length (x), as opposed to the designed contact structure length, shall be used to obtain the most accurate line spacing measurement. For example, the actual via bar length used in the layout 300 shall be used, as opposed to the theoretical design length. Also, as above, the contact structure length may be measured at the intersection with the plane defined by the top surface of the metal lines 302, 304, 306, 308, and 310 (see FIGS. 10, 11).

The via bar length (x) may be independently determined using two calibration layouts (not shown) similar to the layout 300 depicted in FIG. 9. Each calibration layout would have a similar number of metal lines, a similar line pitch, and different line widths and line spacing. Both calibration layouts may have a line width and a line pitch larger than minimum processing capabilities such that the calibration layouts may be insensitive to natural line width variations inherent in fabrication processes. The following equations corresponding to the calibration layouts may be used to determine (x), the via bar length:

First Calibration Structure $$x+i_1 r=as_1+bw_1$$

$$p=s_1+w_1$$

Second Calibration Structure $$x+i_2 r=as_2+bw_2$$

$$p=s_2+w_2$$

As above, the contact structure length (x), the line width ($w_1$, $w_2$), and the line spacing ($s_1$, $s_2$) are unknown. The translational increment (r) may be a known parameter. The number if translational increments (i), the number of spaces between the two metal lines measured for continuity (a), and the number of number of metal lines between the two lines measured for continuity (b) may be determined by continuity testing, and are therefore known variables. As known in the art, the pitch (p) is equal to the line width (w) plus the line spacing (s). Furthermore, the contact structure length (x), the translational increment (r), and the pitch are the same in both calibration structures. The equations corresponding to the first and second calibration structures may be rewritten as follows using the known information above:

First Calibration Structure $$x+i_1 r=a(p-w_1)+bw_1$$

Second Calibration Structure $$x+i_2 r=a(p-w_2)+bw_2$$

The contact structure length (x) and the line widths ($w_1$, $w_2$) remain unknown. The line width of the first calibration structure ($w_1$) and the line width of the second calibration structure ($w_2$) may be related by some constant (k), and the constant (k) may be determined from the design line widths and the processing equations, for example the etch bias and the etch depth as a function of design line width. Therefore the relationship between the line width of the first calibration structure ($w_1$) and the line width of the second calibration structure ($w_2$) may be written as the following equation:

$$w_1=kw_2$$

With respect to the calibration structures, three unknown variables remain; the contact structure length (x) and the line widths ($w_1$, $w_2$) remain. The contact structures length (x) may be determined by solving the following three equations for the three unknown variables (x, $w_1$, $w_2$):

$$x+i_1 r=a(p-w_1)+bw_1$$

$$x+i_2 r=a(p-w_2)+bw_2$$

$$w_1=kw_2$$

The equation corresponding to the layout 300 may be solved for the line spacing (s), as follows:

$$x+(1)(6)=4s+3w$$

$$x+6=4s+3(p-s)$$

$$x+6-3p=s$$

Therefore, the line spacing (s), of the layout 300, may be determined by applying the known pitch (p) and the contact structure length (x) as determined using the two calibration structures to the above equation.

Therefore, the line spacing (s) may be determined by using the third layout 300 above. As described above, the number of contact structures required to obtain a metal line spacing measurement may depend on the length of the via bar and the pitch of the metal lines. At a minimum, two different contact structures of the series of contact structures shall each make electrical contact with two different metal lines in order to obtain a measurement for the metal line spacing. In the present embodiment, only six via bars, specifically vias 322-330, may be necessary to obtain a line spacing measurement, however the third layout 300 may include more than six via bars to eliminate a need for precisely locating the series of via bars relative to the metal lines.

Another test layout which may be used to measure metal line spacing is described in detail below by referring to the accompanying drawings in FIGS. 13-17. In this particular embodiment, a test structure in which the contact structures may extend across, and contact, multiple metal lines having a common line pitch and a repeating non-uniform line spacing pattern.

Figure 13:
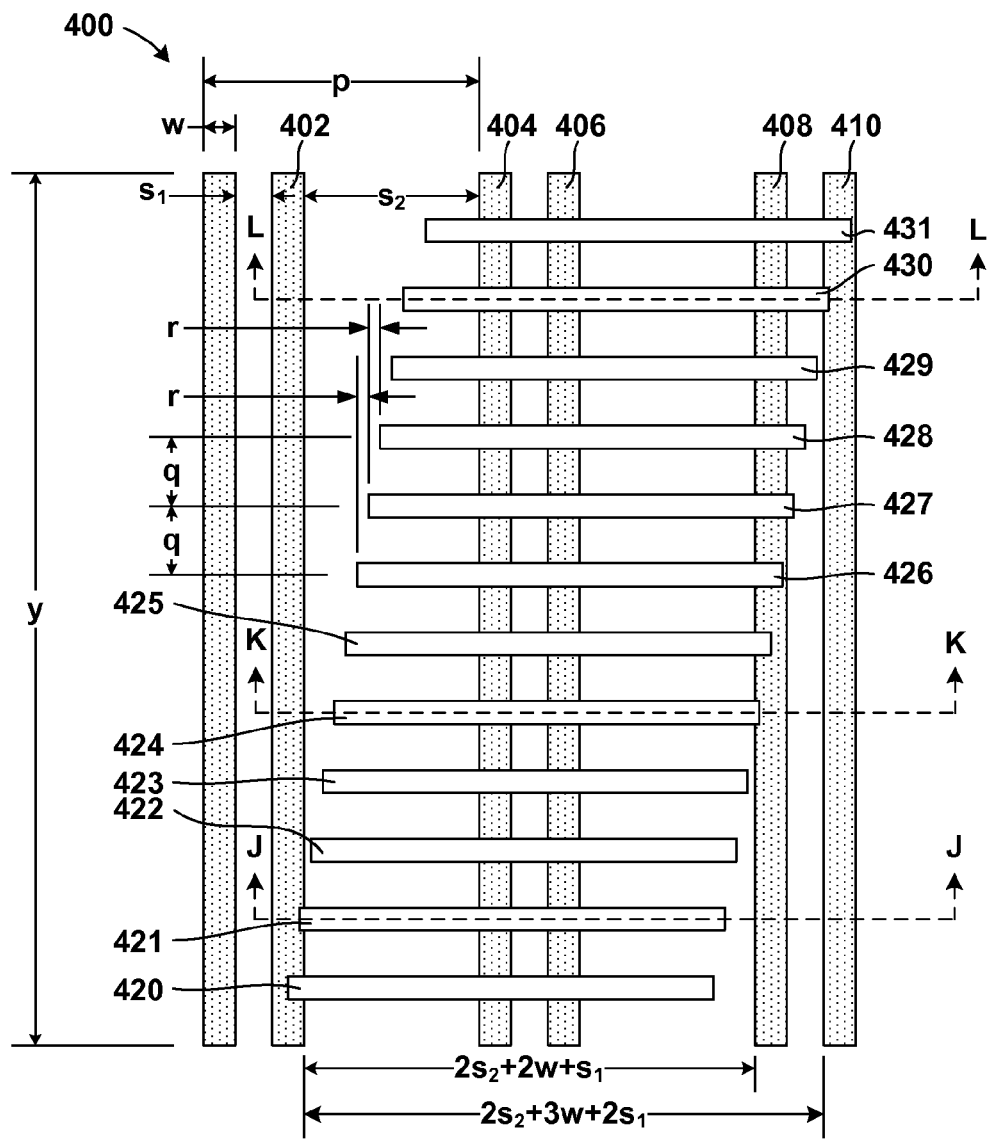
FIG. 13 depicts a test layout used to measure the metal line spacing of a microelectronic structure according to an exemplary embodiment.

Referring now to FIG. 13, a cross section view of a fourth macro design layout 400 ("fourth layout 400") is depicted. The fourth layout 400 may include a plurality of metal lines 402-410 located in a first level and a plurality of contact structures located in a second level with the first level being positioned below the second level. The contact structures may include a series of via bars 420-431. Some of the series of via bars 420-431 may be in electrical contact with some of the plurality of metal lines 402-410. For example the via bars 420-421 may be in electrical contact with the metal line 402, the via bars 424-431 may be in electrical contact with the metal line 408, and the via bars 430-431 may be in electrical contact with the metal line 410. Furthermore, any number of contact structures may be used; however, a minimum number of contact structures may be required to obtain a measurement. The minimum number of contact structures required may depend on the line pitch and the contact structure size, as described in detail below.

In one embodiment, the via bars 420-431 may all be the same width and length while being evenly spaced apart from one another along the length of the metal lines 402-431. For example, as shown in the figure, the via bar 426 may be spaced by a distance (q) from the via bar 427 in the direction parallel to the metal lines 402-410. The distance (q) may be measured from the center of one via bar to the center of an adjacent via bar, as shown in the figure. It should be noted that even spacing between the via bars 420-431 in the direction parallel with the metal lines 402-410 may be preferred, however other embodiments in which the via bar spacing in the direction parallel to the metal lines 402-410 is not even are explicitly contemplated Also, each of the via bars 420-431 may have a unique incremental position along a direction perpendicular to the metal lines 402-410. For example, as shown in figure, the via bar 426 may be incrementally spaced by a distance (r) from the via bar 427, and the via bar 427 may be incrementally spaced by the same distance (r) from the via bar 428. The distance (r) may be measured from the leading edge of one via bar to the leading edge of an adjacent via bar, as shown in the figure. The incremental distance (r) may be equal to one unit of measurement. It may be recognized by one skilled in the art that the accuracy of the line spacing measurement may increase as the unit of measurement decreases. All the via bars 420-431 may be incrementally spaced by the same unit of measurement. For example, all of the via bars in the series may be spaced by a distance (r) in a direction perpendicular to the metal lines 402-410. In one embodiment, a single unit of measurement may be equal to 1 nm. Therefore, one skilled in the art may be able to calculate a distance perpendicular to the metal lines 402-410 between two via bars based a particular number of via bars. For example, the distance measured perpendicular to the metal lines 402-410 between the center of the via bar 420 and the center of the via bar 431 is 11 units, or 11 nm.

The metal lines 402-410 may be designed with a common width (w) and a common pitch (p), and may include a repeating non-uniform line spacing pattern. The pitch (p) of the metal lines may be equal to multiple line widths plus multiple line spacings between the beginning and end of the repeating pattern. For example, the pitch (p) of the metal lines may be equal to two line widths (w) plus two line spacings ($s_1$, $s_2$). It may be noted that the width (w) of the metal lines 402-410 and the metal line spacing ($s_1$, $s_2$), as depicted in FIG. 13, corresponds to the width and spacing measured at a top surface of the metal lines 402-410. The metal line spacing ($s_1$, $s_2$) may be equal to the distance between to adjacent metal lines, as depicted in the figures. The metal lines 402-410 may be any suitable length (y), however, a minimum length may be required as determined by the size and spacing of the contact structures, for example the via bars 420-431. In one embodiment, the via bar length (x) (shown in FIG. 14) may be equal to about 3.5 times the line pitch (p), however a via bar length (x) larger or smaller than 3.5 times the line pitch (p) may be contemplated.

Figure 14:
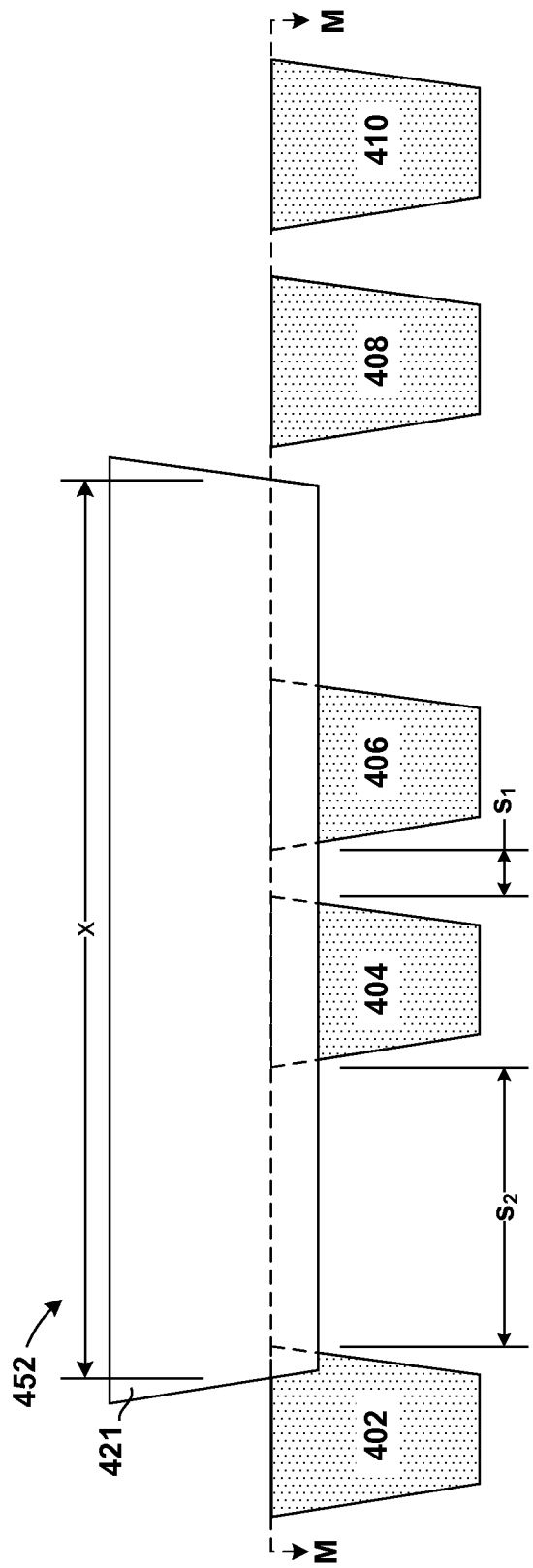
FIG. 14 depicts a cross section view, section J-J, of FIG. 13 according to an exemplary embodiment.

Referring now to FIG. 14, a cross sectional view of FIG. 13, section J-J, is shown. FIG. 14 depicts a first via orientation 452 in which the via bar 421 may be in electrical contact with the metal lines 402, 404, 406. The length of the via bar 422, for example (x), may be measured at the intersection with the plane defined by the top surface of the metal lines 402, 404, 406. Generally, the contact structures, for example the via bars 420-431, may be designed to extend from a top surface of the second level to a location below the top surface of the metal lines 402-410 to ensure electrical contact between the via bars and the metal lines may be achieved. The dimension (x) may be used as the via bar length because the desired line spacing measurement, for example (s, $s_1$), shall be taken along a plane defined by the top surface of the metal lines 402-410. It should be noted that the first and second levels are omitted from FIG. 14 for illustrative purposes only.

Figure 15:
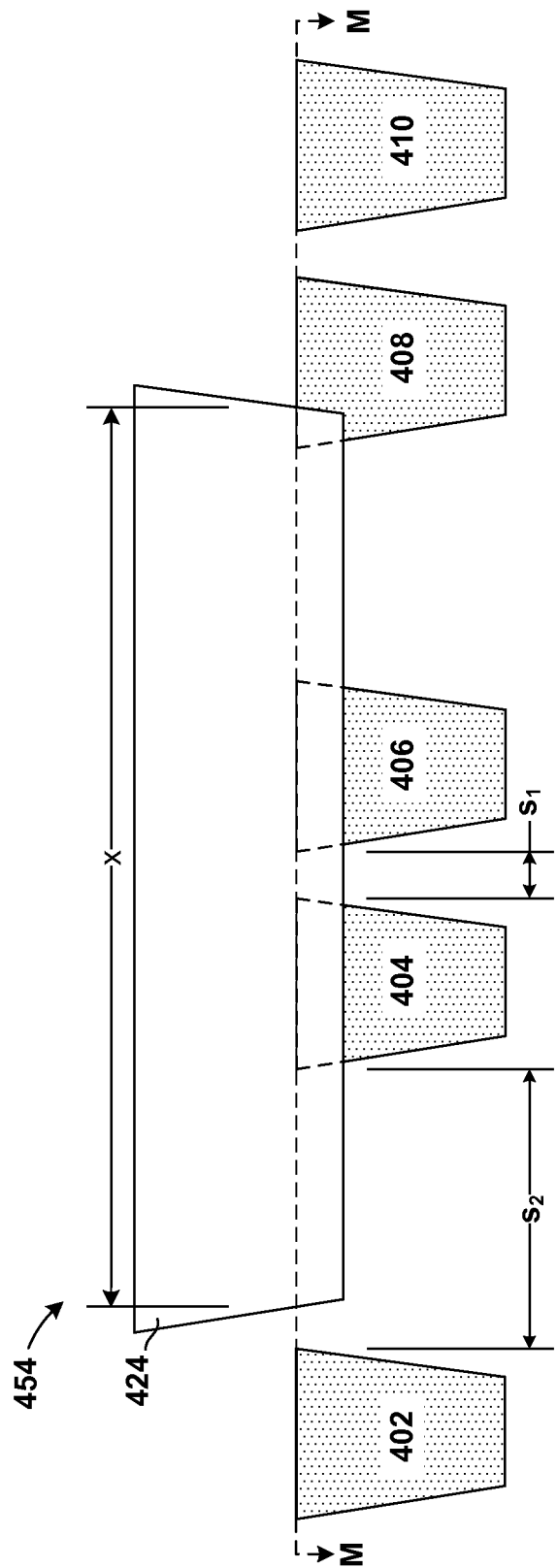
FIG. 15 depicts a cross section view, section K-K, of FIG. 13 according to an exemplary embodiment.

Referring now to FIG. 15, a cross sectional view of FIG. 13, section K-K, is shown. FIG. 15 depicts a second via orientation 454 in which the via bar 424 may be in electrical contact with the metal lines 404, 406, 408. Like in FIG. 14, dimension (x) may represent the size of the via bar 424, and the dimension (s, $s_1$) may represent the spacing between metal lines. It should be noted that the first and second levels are also omitted from FIG. 15 for illustrative purposes only.

Figure 16:
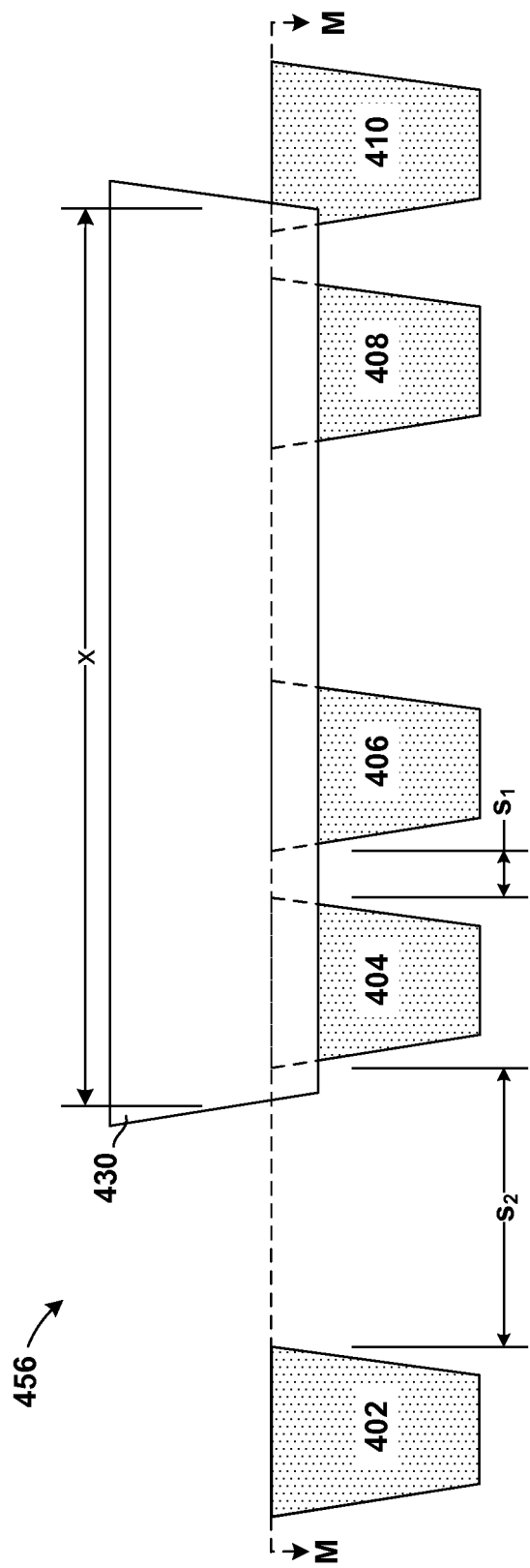
FIG. 16 depicts a cross section view, section L-L, of FIG. 13 according to an exemplary embodiment.

Referring now to FIG. 16, a cross sectional view of FIG. 13, section L-L, is shown. FIG. 16 depicts a third via orientation 456 in which the via bar 430 may be in electrical contact with the metal lines 404, 406, 408, 410. Like in FIG. 14, dimension (x) may represent the size of the via bar 430, and the dimension (s, $s_1$) may represent the spacing between metal lines. It should be noted that the first and second levels are also omitted from FIG. 16 for illustrative purposes only. It should also be noted, for clarification and understanding, that FIG. 13 represents a cross sectional view of FIGS. 14 and 15, section M-M.

Figure 17:
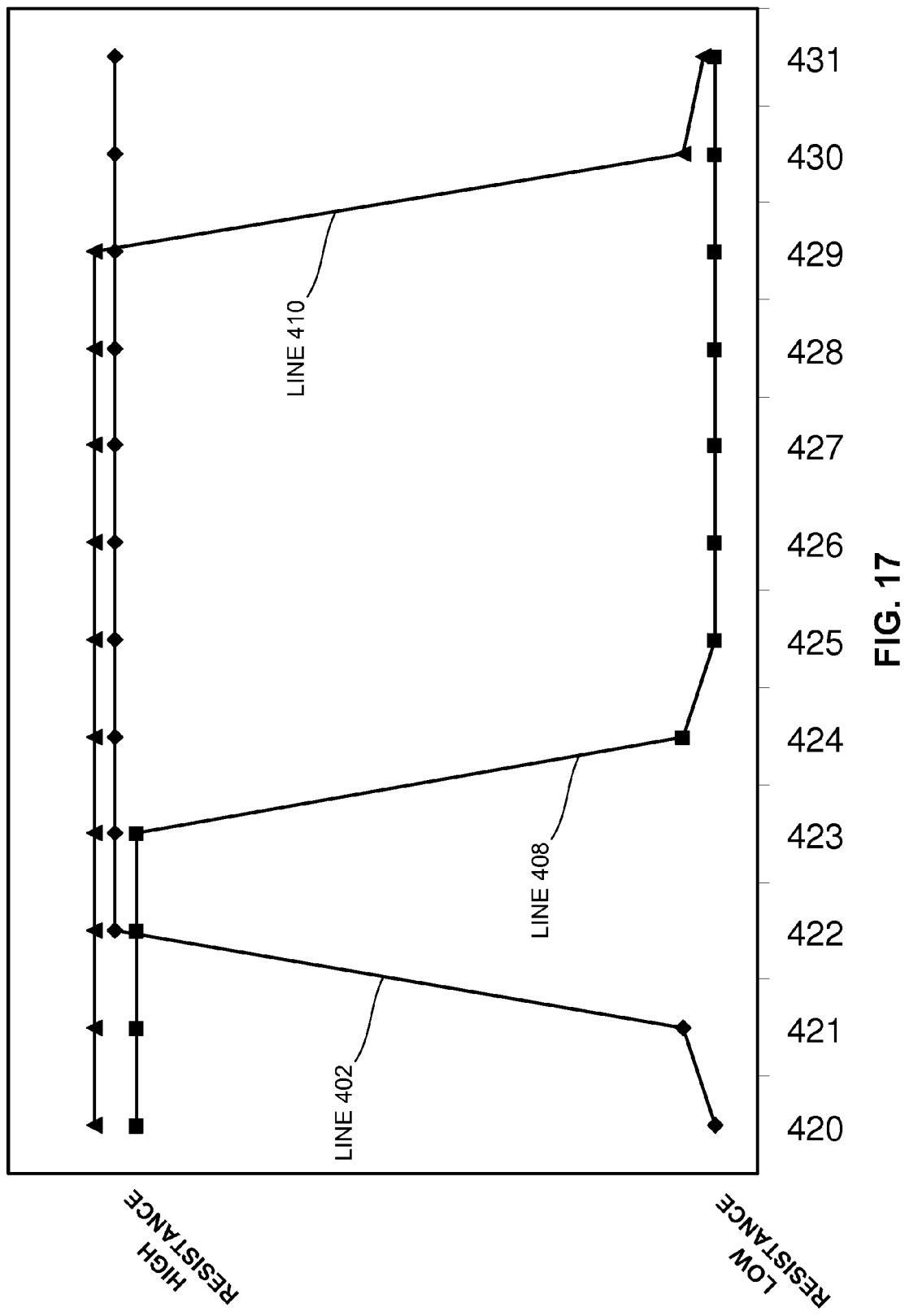
FIG. 17 depicts test data after conducting continuity testing on the test layout of FIG. 13 according to an exemplary embodiment.

Referring now to FIG. 17, a chart depicting electrical continuity measurements between the vias 420-431 and metal lines 402, 408, and 410. Known techniques may be used to make electrical contact with the metal lines 402, 408, and 410 and the vias 420-431. In one embodiment, an additional structure, for example a via, may be formed above each metal line which may be used to make electrical contact to the corresponding metal line for continuity testing. In one embodiment, electrical contact may be made directly to the via bars 420-431 for continuity testing. The electrical continuity measurement may be depicted along the y, or vertical, axis of the chart and may be characterized generally as "high resistance" and "low resistance." High resistance may indicate no electrical continuity, or lack of an electrical connection between the corresponding via and metal line. Low resistance may indicate electrical continuity or the existence of an electrical connection between the corresponding via and metal line. The via bar number may be depicted along the x, or the horizontal, axis of the chart, and the metal lines may be represented by the two distinct line plots, as labeled in FIG. 17.

The chart provides data regarding which via bars may be electrically connected to which metal lines. In the present example, continuity may be measured only between the metal line 402 and the via bars 420-431, between the metal line 408 and the via bars 420-431, and between the metal line 410 and the via bars 420-431. For example, reading the line plot for the metal line 402, the via bars 420-421 may have low resistance measurements, and therefore may be in electrical contact with the metal line 402. Conversely, vias 422-431 may have high resistance measurements, and therefore may not be in electrical connection with the metal line 402. Similarly, reading the line plot for the metal line 408, the via bars 424-431 may have low resistance measurements, and therefore may be in electrical connection with the metal line 408. Conversely, the via bars 420-423 may have high resistance measurements, and therefore may not be in electrical connection with the metal line 408. Likewise, reading the line plot for the metal line 410, the via bars 430-431 may have low resistance measurements, and therefore may be in electrical connection with the metal line 410. Conversely, the via bars 420-429 may have high resistance measurements, and therefore may not be in electrical connection with the metal line 410.

A measurement procedure for the metal line spacing of the fourth layout 400, for example (s), according to one embodiment, will now be described in detail below. It should be noted that the current measurement procedure will incorporate the use of the third layout 300 in which the contact structures are via bars that may span across, and make electrical contact with, multiple metal lines. A similar measurement procedure as applied to the third layout 300 above may be applied to the fourth layout 400. The equations are as follows:

$$x+nr=2s_2+2w+s_1$$

$$x+mr=2s_2+3w+2s_1$$

$$p=2w+s_2+s_1$$

where (x) is the contact structure length, (n) is the number of translational increments between the first via bar orientation 352 (shown in FIG. 14) and the second via bar orientation 354 (shown in FIG. 15), (m) is the number of translational increments between the second via bar orientation 354 (shown in FIG. 15) and the third via bar orientation 356 (shown in FIG. 16), (r) is the known translational increment, ($s_1$, $s_2$) are the line spacing, and (w) is the line width. The contact structure length (x), the line width (w), and the line spacing ($s_1$, $s_2$) are unknown. The number if translational increments (n, m) and the translational increment (r) may be determined by continuity testing.

Like above, the contact structure length (x) may be determined using calibrations structures. Knowing the contact structure length (x), the three equations above may be solved for the three remaining unknown variables (w, $S_1$, $s_2$).

With continued reference to FIG. 13 and as described above, the test layout 400 may represent a series of parallel metal lines having a common line pitch and a repeating non-uniform line spacing pattern. Similar measurement techniques as described above may also be applied to layouts in which pitch splitting may be used to reduce the effective line spacing. Pitch splitting may include forming an array of parallel metal lines in between an existing array of parallel metal lines. Furthermore, pitch splitting may allow for the fabrication of metal lines with line spacing dimensions less than typical fabrication limitations. In such instances, the test layout may include a series of parallel metal lines having a common line pitch and a repeating non-uniform line width pattern.

Figure 18:
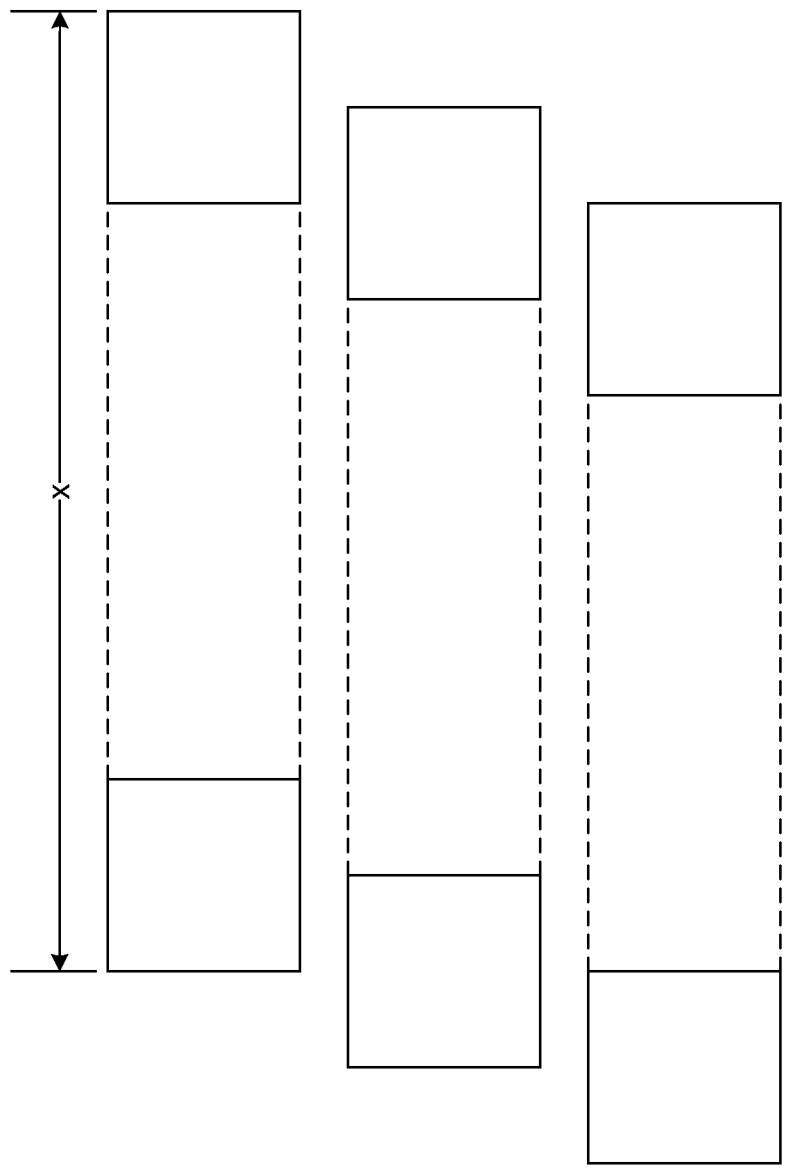
FIG. 18 depicts an alternate contact structure arrangement according to an exemplary embodiment.

Referring now to FIG. 18, in one embodiment, multiple pairs of vias may be used in place of the via bars depicted in FIGS. 9, 13. Each pair of vias may have the same characteristics as a single via bar with each via indicating one end of a fictional via bar. For example, the contact structure length (x) may simply be the measurement from the leading edge of one via to the trailing edge of the other via, and therefore would be similar too the length of the a via bar. In other words, the pair of vias may define the beginning and end of a single fictional via bar. Also, the pair of via bars may be described as a single via bar with a middle portion removed. Similar principles and testing procedures as described above with respect to the layout 300 may be applied to a layout using pairs of vias in place of via bars.

Figure 19:
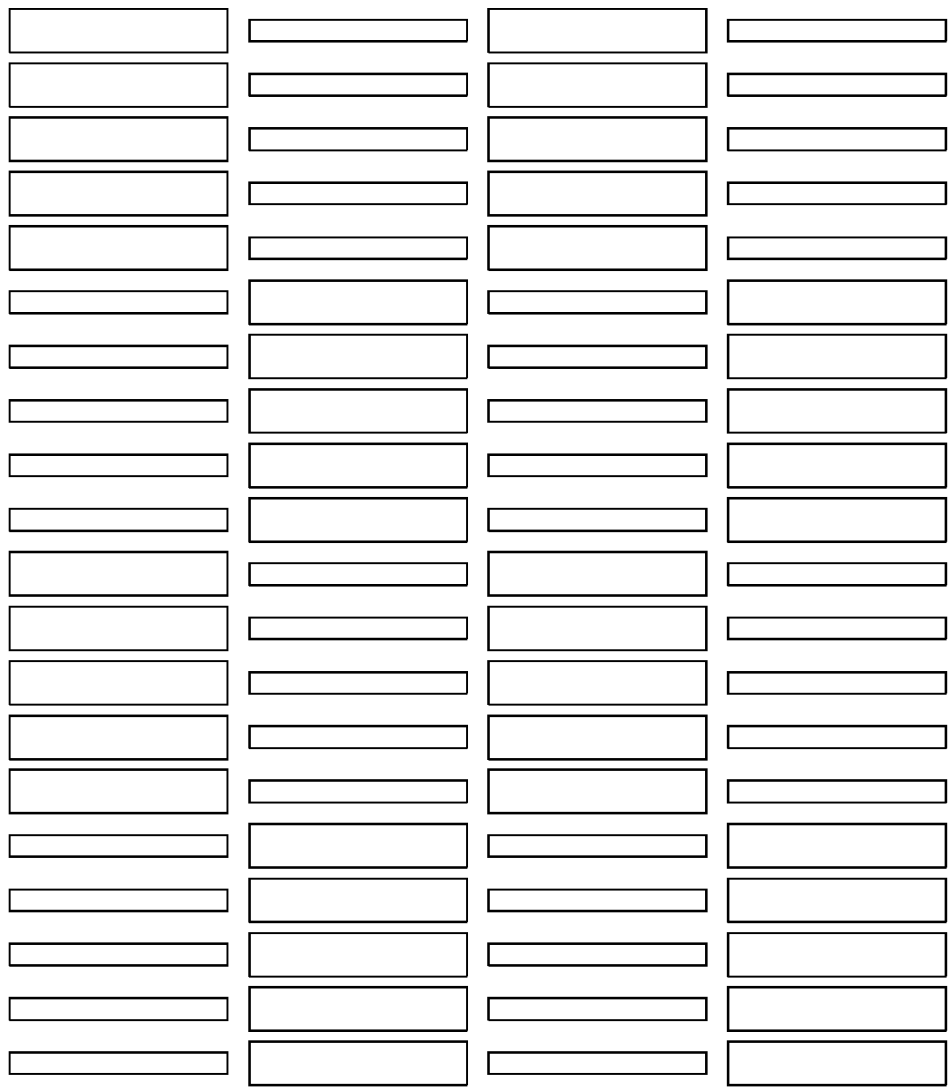
FIG. 19 depicts an alternate test layout arrangement according to an exemplary embodiment.

Referring now to FIG. 19, an array 500 maybe use to mitigate the undesirable effects of metal line density on chemical mechanical polishing processes. The array 500 may be incorporated into any of the layouts mentioned above.

The above techniques may be applied to determine the line spacing between a variety of metal line structures having a combination of varying line spacing and lie widths. Structures having constant line spacing but varying line widths, as well as structures having constant line widths but varying line spacing are explicitly contemplated herein.

Furthermore, the macro designs described above may be fabricated on a test site located near active areas of the semiconductor wafer. Therefore, the line spacing of nearby active areas may be estimated with high accuracy by measuring the line spacing of the macro designs on the test site.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A test layout structure, the structure comprising:
   a first series of parallel metal lines in a first level, the first series of parallel metal lines comprising a first metal line and a second metal line;
   a first series of contact structures in a second level, the second level being positioned above the first level,
   wherein each contact structure of the first series of contact structures is spaced apart from an immediately adjacent contact structure by a distance 'q' in a direction parallel to the first metal line and by a distance 'r' in a direction perpendicular to the first metal line,
   wherein a contact area between one contact structure of the first series of contact structures and the first metal line is less than or greater than a contact area between an immediately adjacent contact structure of the first series of contact structures and the first metal line.

2. The structure of claim 1, wherein the first series of parallel metal lines comprises a common line pitch and a common line spacing.

3. The structure of claim 1, wherein the first series of parallel metal lines comprises a common line pitch and a repeating non-uniform line spacing pattern.

4. The structure of claim 1, wherein the first series of parallel metal lines comprises a common line pitch and a repeating non-uniform line width pattern.

5. The structure of claim 1, wherein the first series of contact structures are vias comprising a width less than the line spacing of the first series of parallel metal lines.

6. The structure of claim 1, wherein the first series of contact structures are vias comprising a width greater than the line spacing of the first series of parallel metal lines.

7. The structure of claim 1, wherein the first series of contact structures are via bars comprising a length longer than a width, and each via bar is in electrical contact with one or more of the first series of parallel metal lines.

8. The structure of claim 1, wherein the first series of contact structures are a pair of vias each comprising a common width and spaced apart from each other by a common distance, and each of the pair of vias is in electrical contact with one or more of the first series of parallel metal lines.

9. The structure of claim 1, further comprising:
a first calibration layout comprising a second series of parallel metal lines and a second series of contact structures, the second series of contact structures being positioned at known increments, wherein the increments are in a direction perpendicular to a length of the second series parallel of metal lines, wherein one or more of the second series of contact structures is in electrical contact with one or more of the second series of parallel metal lines, and wherein the second series of parallel metal lines have a width and a line pitch greater than minimum processing capabilities;
a second calibration layout comprising a third series of parallel metal lines and a third series of contact structures, the third series of contact structures being positioned at known increments, wherein the increments are in a direction perpendicular to a length of the third series of parallel metal lines, wherein one or more of the third series of contact structures is in electrical contact with one or more of the third series of parallel metal lines, and wherein the third series of parallel metal lines have a width and a line pitch greater than minimum processing capabilities with a similar line pitch and a different line width than the first calibration structure.

10. A method of measuring the line spacing between the top of two parallel metal lines, the method comprising:
measuring the resistance between a first series of contact structures and a first metal line and a second metal line of a first series of parallel metal lines of a test layout, each contact structure of the first series of contact structures is spaced apart from an immediately adjacent contact structure by a distance 'q' in a direction parallel to the first metal line and by a distance 'r' in a direction perpendicular to the first metal line,
wherein a contact area between one contact structure of the first series of contact structures and the first metal line is less than or greater than a contact area between an immediately adjacent contact structure of the first series of contact structures and the first metal line; and
determining a line spacing measurement based on parameters obtained from measuring the resistance and known physical parameters of the test layout.

11. The method of claim 10, further comprising:
measuring the resistance between a second series of contact structures and two or more of a second series of parallel metal lines of a first calibration layout structure, the second series of contact structures being positioned at known increments, wherein the increments are in a direction perpendicular to a length of the second series of parallel metal lines; and
measuring the resistance between a third series of contact structures and two or more of a third series of parallel metal lines of a second calibration layout structure, the third series of contact structures being positioned at known increments, wherein the increments are in a direction perpendicular to a length of the third series of metal lines.

12. The method of claim 10, wherein the first series of parallel metal lines comprises a common line pitch and a common line spacing.

13. The method of claim 10, wherein the first series of parallel metal lines comprises a common line pitch and a repeating non-uniform line spacing pattern.

14. The method of claim 10, wherein the first series of parallel metal lines comprises a common line pitch and a repeating non-uniform line width pattern.

15. The method of claim 10, wherein the first series of contact structures are vias comprising a width less than the line spacing of the first series of parallel metal lines.

16. The method of claim 10, wherein the first series of contact structures are vias comprising a width greater than the line spacing of the first series of parallel metal lines.

17. The method of claim 10, wherein the first series of contact structures are via bars comprising a length longer than a width, and each via bar is in electrical contact with one or more of the first series of parallel metal lines.

18. The method of claim 10, wherein the first series of contact structures are a pair of vias each comprising a common width and spaced apart from each other by a common distance, and each of the pair of vias is in electrical contact with one or more of the first series of parallel metal lines.

19. A test layout structure, the structure comprising:
a plurality of parallel metal lines in a first level, the plurality of parallel metal lines comprising a first metal line and a second metal line; and
a plurality of contact structures in a second level directly above the first level, the plurality of contact structures are evenly spaced in a straight line, the straight line crosses the plurality of parallel metal lines at an angle other than 0 and 90 degrees, such that at least some of the plurality of contact structures are in direct contact with the first metal line and at least some of the plurality of contact structures are in direct contact with the second metal line,
wherein a contact area between one contact structure of the plurality of contact structures and the first metal line is less than or greater than a contact area between an immediately adjacent contact structure in the plurality of contact structures and the first metal line.

* * * * *